(12) United States Patent
Wu et al.

(10) Patent No.: US 12,283,320 B2
(45) Date of Patent: Apr. 22, 2025

(54) DATA PROCESSING METHOD BASED ON MEMRISTOR ARRAY AND ELECTRONIC APPARATUS

(71) Applicant: TSINGHUA UNIVERSITY, Beijing (CN)

(72) Inventors: Huaqiang Wu, Beijing (CN); Zhengwu Liu, Beijing (CN); Jianshi Tang, Beijing (CN); Bin Gao, Beijing (CN); He Qian, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 17/788,408

(22) PCT Filed: Dec. 14, 2021

(86) PCT No.: PCT/CN2021/137845
§ 371 (c)(1),
(2) Date: Jun. 23, 2022

(87) PCT Pub. No.: WO2022/222498
PCT Pub. Date: Oct. 27, 2022

(65) Prior Publication Data
US 2024/0170060 A1    May 23, 2024

(30) Foreign Application Priority Data

Apr. 20, 2021  (CN) .......................... 202110426351.9

(51) Int. Cl.
*G06N 3/063*   (2023.01)
*G06F 17/15*   (2006.01)
(Continued)

(52) U.S. Cl.
CPC .......... *G11C 13/0069* (2013.01); *G06F 17/15* (2013.01); *G06F 17/16* (2013.01);
(Continued)

(58) Field of Classification Search
CPC ...................................................... G06N 3/063
See application file for complete search history.

(56) References Cited

U.S. PATENT DOCUMENTS 11,195,080 B1*  12/2021  Nama .................... G06N 3/045
2019/0294416 A1*  9/2019  Hu ............................ G11C 7/16
(Continued)

FOREIGN PATENT DOCUMENTS

CN              113077829 A      7/2021

*Primary Examiner* — Douglas King
(74) *Attorney, Agent, or Firm* — Scully, Scott, Murphy & Presser, P.C.

(57) ABSTRACT

A data processing method based on a memristor array and an electronic apparatus are disclosed. The data processing method based on a memristor array includes: acquiring a plurality of first analog signals; setting the memristor array, and writing data corresponding to a convolution parameter matrix of a convolution processing into the memristor array; inputting the plurality of first analog signals respectively into a plurality of column signal input terminals of the memristor array that has been set, controlling operation of the memristor array to perform the convolution processing on the plurality of first analog signals, and obtaining a plurality of second analog signals after performing the convolution processing at a plurality of row signal output terminals of the memristor array, respectively.

20 Claims, 11 Drawing Sheets

(51) Int. Cl.
*G06F 17/16* (2006.01)
*G06N 3/09* (2023.01)
*G11C 13/00* (2006.01)

(52) U.S. Cl.
CPC ............... *G06N 3/063* (2013.01); *G06N 3/09* (2023.01); *G11C 13/0026* (2013.01); *G11C 13/0028* (2013.01); *G11C 2213/79* (2013.01)

(56) References Cited

U.S. PATENT DOCUMENTS

2020/0026992 A1\* 1/2020 Zhang .................... G06N 3/084
2020/0133994 A1\* 4/2020 Chatterjee ........... G06F 9/30036
2020/0175379 A1\* 6/2020 Wu ........................ G06N 3/084

\* cited by examiner

FIG. 5B

DATA PROCESSING METHOD BASED ON MEMRISTOR ARRAY AND ELECTRONIC APPARATUS

The application claims priority to the Chinese patent application No. 202110426351.9 filed on Apr. 20, 2021, the entire disclosure of which is incorporated herein by reference as part of the present application.

TECHNICAL FIELD

Embodiments of the present disclosure relate to a data processing method based on a memristor array and an electronic apparatus.

BACKGROUND

With the advancement of science and technology and the rapid development of information technology, people may collect a large amount of data through the Internet of Things sensing technology. It is necessary to perform low-power and high energy-efficient analysis and processing on these large amount of data to quickly extract data features and information.

Convolution processing is a commonly used linear operation which is widely used in the field of signal processing, image processing, neural network and so on. The convolution result obtained by performing convolution processing on two objects indicates how one object is modified by the other object. For example, in the field of signal processing, convolution processing may be used to filter the signal.

SUMMARY

An embodiment of the present disclosure a data processing method based on a memristor array, wherein the memristor array comprises a plurality of memristor units arranged in an array, and the memristor array is configured to perform a multiply-accumulate operation, the method comprises: acquiring a plurality of first analog signals; setting the memristor array, and writing data corresponding to a convolution parameter matrix of a convolution processing into the memristor array, wherein the convolution parameter matrix is a first matrix and comprises a plurality of parameter elements arranged in an array, the plurality of parameter elements are correspondingly mapped to a plurality of memristor sub-arrays in the memristor array for a plurality of times in a form of the first matrix, and the plurality of memristor sub-arrays are different and do not overlap both in a row direction and a column direction of the memristor array; and inputting the plurality of first analog signals respectively into a plurality of column signal input terminals of the memristor array that has been set, controlling operation of the memristor array to perform the convolution processing on the plurality of first analog signals, and obtaining a plurality of second analog signals after performing the convolution processing at a plurality of row signal output terminals of the memristor array, respectively.

For example, in the data processing method provided by at least one embodiment of the present disclosure, wherein acquiring a plurality of first analog signals comprises: acquiring a plurality of initial digital signals; performing digital-to-analog conversion processing on the plurality of initial digital signals to obtain the plurality of first analog signals, respectively.

For example, in the data processing method provided by at least one embodiment of the present disclosure, wherein each memristor sub-array corresponds to the first matrix, and the plurality of memristor sub-arrays correspond to different column signal input terminals, respectively, the plurality of parameter elements are correspondingly mapped to a plurality of memristor sub-arrays in the memristor array for a plurality of times in a form of the first matrix, comprises: sequentially selecting an object column group to be subjected to the convolution processing from the plurality of column signal input terminals, wherein the object column group comprises at least one column signal input terminal; for a selected object column group, correspondingly mapping the plurality of parameter elements into an object memristor sub-array in the form of the first matrix, wherein the object memristor sub-array is a memristor sub-array corresponding to the selected object column group among the plurality of memristor sub-arrays.

For example, in the data processing method provided by at least one embodiment of the present disclosure, wherein each memristor sub-array comprises a plurality of target memristor units, for a selected object column group, correspondingly mapping the plurality of parameter elements into an object memristor sub-array in the form of the first matrix, comprises: mapping parameter elements of a same row in the first matrix to target memristor units of a same row in the object memristor sub-array; mapping parameter elements of a same column in the first matrix to target memristor units of a same column in the object memristor sub-array.

For example, in the data processing method provided by at least one embodiment of the present disclosure, wherein each row of the convolution parameter matrix comprises Q parameter elements, each memristor unit comprises at least one memristor, each memristor is capable of setting to an initial state, mapping parameter elements of a same row in the first matrix to target memristor units of a same row in the object memristor sub-array, comprises: for each row of parameter elements of the convolution parameter matrix, selecting Q target memristor units from one row of memristor units corresponding to the object memristor sub-array in the memristor array to correspond to the Q parameters element one by one, and then setting memristors in memristor units other than the Q target memristor units in the one row of memristor units to the initial state, wherein Q is a positive integer greater than 1.

For example, in the data processing method provided by at least one embodiment of the present disclosure, wherein selecting Q target memristor units from one row of memristor units corresponding to the object memristor sub-array in the memristor array to correspond to the Q parameters element one by one, comprises: for each parameter element of the Q parameter elements, according to a numerical value of the parameter element, setting at least one memristor comprised in a target memristor unit corresponding to the parameter element in the Q target memristor units as a whole to a conductive state, so as to make the at least one memristor comprised in the target memristor unit available for calculation and have a conductance value corresponding to the numerical value.

For example, in the data processing method provided by at least one embodiment of the present disclosure, wherein sequentially selecting an object column group to be subjected to the convolution processing from the plurality of column signal input terminals, comprises: according to a convolution stride of the convolution processing, sequentially selecting the object column group to be subjected to the convolution processing from the plurality of column signal input terminals.

For example, in the data processing method provided by at least one embodiment of the present disclosure, wherein the convolution parameter matrix is the first matrix arranged in 2*P rows and Q columns, the convolution parameter matrix comprises a first sub-convolution parameter matrix with P rows and Q columns and a corresponding second sub-convolution parameter matrix with P rows and Q columns, a parameter element in the first sub-convolution parameter matrix and a parameter element of a position with a corresponding row and column in the second sub-convolution parameter matrix collectively represent a parameter element for performing the convolution processing, wherein P is a positive integer greater than or equal to 1, and Q is a positive integer greater than 1.

For example, in the data processing method provided by at least one embodiment of the present disclosure, wherein the first sub-convolution parameter matrix comprises P rows of first parameter elements, the second sub-convolution parameter matrix comprises P rows of second parameter elements, row and column positions of the P rows of first parameter elements and the P rows of second parameter elements are in one-to-one correspondence, obtaining a plurality of second analog signals after performing the convolution processing respectively at a plurality of row signal output terminals of the memristor array, comprises: for each memristor sub-array, determining at least one group of rows to be processed, wherein each group of rows to be processed comprises one row of target memristor units corresponding to one row of first parameter elements, and one row of target memristor units corresponding to one row of second parameter elements, wherein the one row of second parameter elements corresponds to the one row of first parameter elements; performing current preprocessing on current signals of two row signal output terminals corresponding to two rows of target memristor units comprised in each group of rows to be processed, to obtain a second analog signal corresponding to each group of rows to be processed.

For example, in the data processing method provided by at least one embodiment of the present disclosure, wherein the memristor array comprises a first memristor array and a second memristor array, the convolution parameter matrix comprises a first sub-convolution parameter matrix and a second sub-convolution parameter matrix, and the first sub-convolution parameter matrix and the second sub-convolution parameter matrix are both in the form of the first matrix, the first sub-convolution parameter matrix is correspondingly mapped to different memristor sub-arrays in the first memristor array for a plurality of times in the form of the first matrix, the second sub-convolution parameter matrix is correspondingly mapped to different memristor sub-arrays in the second memristor array for a plurality of times in the form of the first matrix.

For example, in the data processing method provided by at least one embodiment of the present disclosure, wherein obtaining a plurality of second analog signals after performing the convolution processing respectively at a plurality of row signal output terminals of the memristor array, comprises: performing current preprocessing on a current signal of each row signal output terminal in the first memristor array and a current signal of a corresponding row signal output terminal in the second memristor array, to obtain the plurality of second analog signals.

For example, in the data processing method provided by at least one embodiment of the present disclosure, wherein the current preprocessing is a current subtraction processing or a current addition processing.

For example, the data processing method provided by at least one embodiment of the present disclosure further comprises: performing analog-to-digital conversion processing on the plurality of second analog signals, to convert the plurality of second analog signals into a plurality of digital signals for subsequent processing.

For example, in the data processing method provided by at least one embodiment of the present disclosure, wherein the plurality of first analog signals are analog voltage signals, and the plurality of second analog signals are analog current signals.

At least one embodiment of the present disclosure provides an electronic apparatus, comprises: an memristor array, configured to perform multiply-accumulate operation; a signal acquisition apparatus, configured to acquire a plurality of first analog signals; a control driving circuit, wherein the control drive circuit is configured to perform following steps: setting the memristor array, and writing data corresponding to a convolution parameter matrix of a convolution processing into the memristor array, wherein the convolution parameter matrix is a first matrix and comprises a plurality of parameter elements arranged in an array, the plurality of parameter elements are correspondingly mapped to a plurality of memristor sub-arrays in the memristor array for a plurality of times in a form of the first matrix, and the plurality of memristor sub-arrays are different and do not overlap both in a row direction and a column direction of the memristor array; and inputting the plurality of first analog signals respectively into a plurality of column signal input terminals of the memristor array that has been set, controlling operation of the memristor array to perform the convolution processing on the plurality of first analog signals, and obtaining a plurality of second analog signals after performing the convolution processing at a plurality of row signal output terminals of the memristor array, respectively.

For example, in the electronic apparatus provided by at least one embodiment of the present disclosure, wherein the signal acquisition apparatus comprises a digital signal acquisition circuit and a digital-to-analog conversion circuit, the digital signal acquisition circuit is configured to acquire a plurality of initial digital signals; the digital-to-analog conversion circuit is configured to perform digital-to-analog conversion processing on the plurality of initial digital signals to obtain the plurality of first analog signals respectively.

For example, in the electronic apparatus provided by at least one embodiment of the present disclosure, wherein the control driving circuit comprises: a source line driving circuit, configured to detect the plurality of second analog signals and perform initialization operation on the memristor array; a word line driving circuit, configured to apply turn-on signals to a plurality of signal control terminals of the memristor array and perform initialization operation on the memristor array; and a bit line driving circuit, configured to apply input signals to the plurality of column signal input terminals and perform initialization operation on the memristor array, wherein the input signals at least comprises the plurality of first analog signals.

For example, the electronic apparatus provided by at least one embodiment of the present disclosure further comprises: a data output circuit, wherein the data output circuit is configured to convert the plurality of second analog signals into digital signals, to respectively convert the plurality of second analog signals into a plurality of digital signals for subsequent processing.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

FIG. 5B is a schematic diagram of another memristor array after writing a convolution parameter matrix provided by at least one embodiment of the present disclosure;

DETAILED DESCRIPTION

Figure 1:
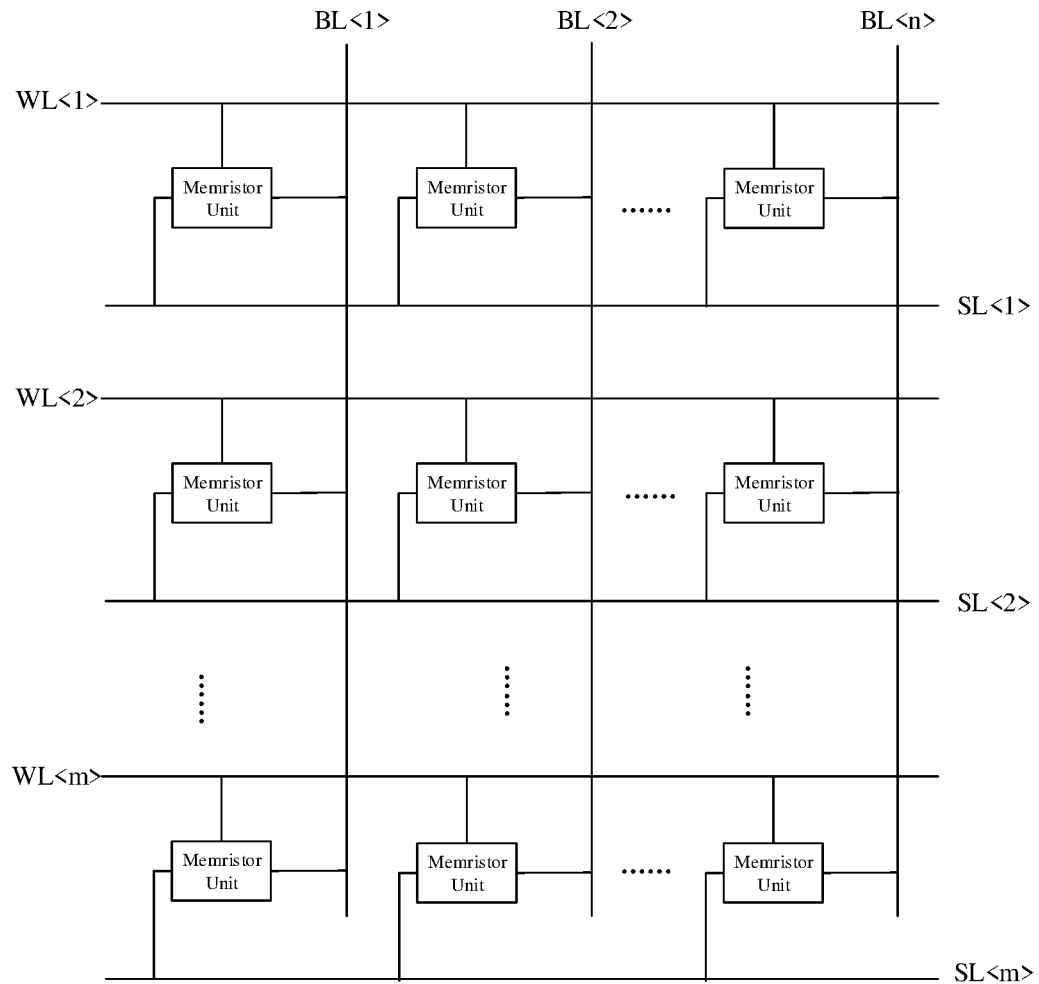
FIG. 1 shows a schematic structure of a memristor array.

Embodiments of the present disclosure will be described in more detail below with reference to the accompanying drawings. Although some embodiments of the present disclosure are shown in the drawings, it should be understood that the present disclosure may be implemented in various forms and should not be construed as limited to the embodiments set forth here. On the contrary, these embodiments are provided for a more thorough and complete understanding of the present disclosure. It should be understood that the drawings and embodiments of this disclosure are only for illustrative purposes, and are not intended to limit the scope of protection of this disclosure.

As used herein, the term "comprise/include" and its variations are open-ended including, that is, "include but not limited to". The term "based on" means "based at least in part". The term "an embodiment" means "at least one embodiment"; the term "another embodiment" means "at least one other embodiment"; the term "some embodiments" means "at least some embodiments". Relevant definitions of other terms will be given in the following description.

It should be noted that the concepts of "first" and "second" mentioned in this disclosure are only used to distinguish different devices, modules or units, and are not used to limit the order or interdependence of the functions performed by these devices, modules or units.

It should be noted that the modifications of "one" and "a plurality of" mentioned in this disclosure are illustrative rather than restrictive, and those skilled in the art should understand that unless the context clearly indicates otherwise, they should be understood as "one or more".

It should be understood that the various steps described in the method embodiments of the present disclosure may be performed in a different order, and/or in parallel. In addition, the method embodiments may include additional steps and/or omit the steps shown. The scope of the present disclosure is not limited in this respect. The names of messages or information exchanged between devices in this embodiment are only for illustrative purposes, and are not intended to limit the scope of these messages or information.

At present, traditional technology platform, such as CPU (Central Processing Unit), GPU (Graphics Processing Unit) and other platforms using von Neumann architecture, are usually used to process large amounts of data. As Moore's Law is approaching its limit, the computing power gains achieved by these traditional computing platforms are coming to an end.

The memristor (such as the resistive memory, the phase change memory, the conductive bridge memory, etc.) is a new type of micro-nano electronic device whose conductance state may be adjusted by applying external excitation. The working mechanism of the memristor is similar to the synapses and neurons in the human brain, so the memristor has a wide range of application prospects in neuromorphic computing. According to Kirchhoff's current law and Ohm's law, an array composed of such devices may perform the multiply-accumulate (MAC) operation in parallel, and both storage and calculation occur in each device in the array. Based on this computing architecture, it is possible to achieve an in-memory computing that does not require a large amount of data transfer, which reduces the time for data transfer with higher energy efficiency, lower power consumption, and smaller area during computing.

For example, the analog computation, such as convolution processing, may be implemented using the laws of physics based on the memristor array.

At present, the full-analog computing based on the memristor array requires analog input voltage and analog conductance during operation. When performing common convolution processing such as the signal filtering, only the result value corresponding to one time point may be obtained each time, and the result values at different time points need to be obtained by shifting the analog input voltage. Therefore, this method requires a large number of data shifts to complete a complete convolution processing, resulting in high computational delay and power consumption.

At least one embodiment of the present disclosure provides a data processing method based on a memristor array and an electronic apparatus. The data processing method based on the memristor array includes: acquiring a plurality of first analog signals; setting the memristor array, and writing data corresponding to a convolution parameter matrix of a convolution processing into the memristor array, wherein the convolution parameter matrix is a first matrix and comprises a plurality of parameter elements arranged in an array, the plurality of parameter elements are correspondingly mapped to a plurality of memristor sub-arrays in the memristor array for a plurality of times in a form of the first matrix, and the plurality of memristor sub-arrays are different and do not overlap both in a row direction and a column direction of the memristor array; and inputting the plurality of first analog signals respectively into a plurality of column signal input terminals of the memristor array that has been set, controlling operation of the memristor array to perform the convolution processing on the plurality of first analog signals, and obtaining a plurality of second analog signals after performing the convolution processing at a plurality of row signal output terminals of the memristor array, respectively.

By mapping the convolution parameter matrix for many times to different memristor sub-arrays in the memristor array, the data processing method based on the memristor array is capable of obtaining all the result values of the convolution processing in one calculation (or one calculation cycle), which greatly reduces the time required for data shifting, reduces power consumption, and improves the calculation speed.

At least one embodiment of the present disclosure also provides an electronic apparatus corresponding to the data processing method based on the memristor array.

The embodiments of the present disclosure will be described in detail below with reference to the accompanying drawings, but the present disclosure is not limited to these specific embodiments.

FIG. 1 shows a schematic structure of a memristor array. The memristor array is composed of a plurality of memristor units, and the plurality of memristor units form an array of m rows and n columns, where m and n are both positive integers. Each memristor unit includes a switching element and one or more memristors. In FIG. 1, WL<1>, WL<2> ... WL<m> represent the word lines of the first row, the second row ... the m-th row, respectively, and the control electrodes (e.g. gate electrodes of transistors) of the switching elements in the memristor units of each row are connected to the word line corresponding to the row; BL<1>, BL<2> ... BL<n> represent the bit lines of the first column, the second column ... the n-th column, respectively, and the memristors in the memristor units of each column are connected to the bit line corresponding to the column; SL<1>, SL<2> ... SL<m> represent the first line, the second line ... the source line of the m-th line, respectively, and the source electrodes of the transistors in the memristor units of each row are connected to the source line corresponding to the row. According to Kirchhoff's law, by setting the state of the memristor unit (such as resistance value) and applying the corresponding word line signal and bit line signal to the word line and bit line, the above-mentioned memristor array may complete the multiply-accumulate operation in parallel.

The memristor unit in the memristor array of FIG. 1 may have, for example, a 1T1R structure or a 2T2R structure, among which, the memristor unit with a 1T1R structure includes one transistor and one memristor, and the memristor unit with a 2T2R structure includes two transistors and two memristors. It should be noted that the present disclosure does not limit the structure of the memristor unit, and other structural forms of the memristor unit that may realize the multiply-accumulate operation may also be used.

It should be noted that, the transistors used in the embodiments of the present disclosure may all be thin film transistors or field effect transistors (e.g., MOS field effect transistors) or other switching devices with the same characteristics. The source electrode and the drain electrode of the transistor used here may be symmetrical in structure, so the source electrode and drain electrode of the transistor may be indistinguishable in structure. In the embodiments of the present disclosure, in order to distinguish the two electrodes (i.e., the source electrode and the drain electrode) of the transistor other than the gate electrode, it is directly described that one is the first electrode and the other is the second electrode.

Figure 2A:
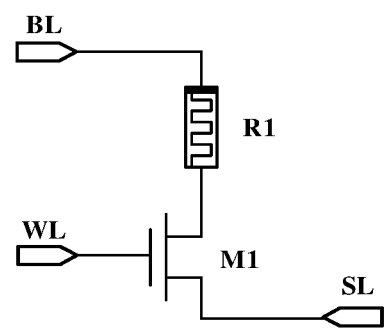
FIG. 2A is a schematic diagram of a memristor unit with a 1T1R structure.

FIG. 2A is a schematic diagram of a memristor unit with a 1T1R structure. As shown in FIG. 2A, the memristor unit with a 1T1R structure includes a transistor M1 and a memristor R1.

Embodiments of the present disclosure do not limit the type of transistors used. For example, when the transistor M1 is an N-type transistor, the gate electrode of the transistor M1 is connected to a word line terminal WL, for example, the transistor M1 is turned on when the word line WL inputs a high level; the first electrode of transistor M1 may be a source electrode and is configured to be connected to a source line SL, for example, the transistor M1 may receive a reset voltage through the source line SL; the second electrode of the transistor M1 may be a drain electrode and configured to be connected to the second electrode (e.g. negative electrode) of the memristor R1, and the first electrode (e.g. positive electrode) of the memristor R1 is connected to a bit line BL, e.g., the memristor R1 may receive the setting voltage through the bit line BL. For example, when the transistor M1 is a P-type transistor, the gate electrode of the transistor M1 is connected to the word line WL, for example, the transistor M1 is turned on when the word line WL inputs a low level; the first electrode of transistor M1 may be a drain electrode and configured to be connected to the source SL, for example, the transistor M1 may receive a reset voltage through the source SL; the second electrode of the transistor M1 may be a source electrode and configured to be connected to the second electrode of memristor R1 (e.g., negative electrode), and the first electrode of the memristor R1 (e.g., positive electrode) is connected to the bit line BL, for example, the memristor R1 may receive a setting voltage through the bit line BL. It should be noted that the structure of the memristor may also be implemented as other structures, for example, a structure in which the second electrode of the memristor R1 is connected to the source line SL, and the embodiments of the present disclosure do not limit this.

Each of the following embodiments is illustrated by taking an N-type transistor as an example for the transistor M1.

The function of the word line WL is to apply a corresponding voltage to the gate electrode of the transistor M1, so as to control the transistor M1 to be turned on or off. When operating the memristor R1, for example, performing a setting operation or a reset operation on the memristor R1, it is necessary to turn on the transistor M1 first, that is, it is necessary to apply a conduction voltage to the gate electrode of the transistor M1 through the word line WL. After the transistor M1 is turned on, for example, the resistance state of the memristor R1 may be changed by applying a voltage to the memristor R1 through the source line SL and the bit line BL. For example, a setting voltage may be applied through the bit line BL to make the memristor R1 in a low resistance state, and for example, a reset voltage may be applied through the source line SL to make the memristor R1 in a high resistance state. For example, the resistance value of the high resistance state is more than 100 times (e.g., 1000 times or more) the resistance value of the low resistance state.

It should be noted that in the embodiments of the present disclosure, by applying a voltage at the word line WL and the bit line BL at the same time, the resistance value of the memristor R1 becomes smaller and smaller, that is, the memristor R1 changes from a high resistance state to a low resistance state, the operation of changing the resistance state from a high resistance state to a low resistance state is called the setting operation. By applying a voltage at the word line WL and the source line SL at the same time, the resistance value of the memristor R1 becomes greater and greater, that is, the memristor R1 changes from a low resistance state to a high resistance state, the operation of changing the resistance state from a low resistance state to a high resistance state is called the reset operation. For example, the memristor R1 has a threshold voltage, and when the amplitude of the input voltage is less than the threshold voltage of memristor R1, the resistance value (or conductance value) of memristor R1 may not be changed. In this case, the calculation may be performed by using the resistance value (or conductance value) of the memristor R1 by inputting a voltage less than the threshold voltage, and the resistance value (or conductance value) of the memristor R1 may be changed by inputting a voltage greater than the threshold voltage.

Figure 2B:
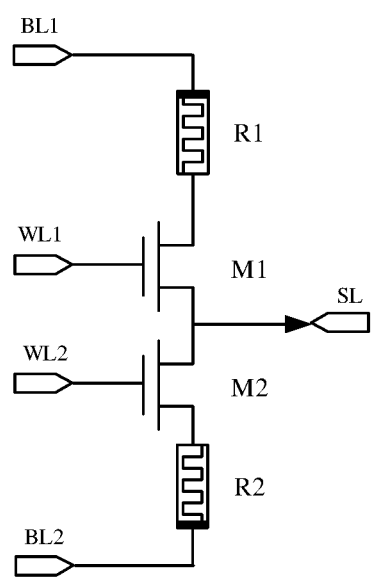
FIG. 2B is a schematic diagram of a memristor unit with a 2T2R structure.

FIG. 2B is a schematic diagram of a memristor unit with a 2T2R structure. As shown in FIG. 2B, the memristor unit with a 2T2R structure includes two transistors M1 and M2 and two memristors R1 and R2. The following description will be given by taking N-type transistors as an example for both the transistors M1 and M2.

The gate electrode of the transistor M1 is connected to the word line WL1, for example, when the word line WL1 connected with the transistor M1 inputs a high level, the transistor M1 is turned on, and the gate electrode of the transistor M2 is connected to the word line WL2, for example, when the word line WL2 connected with the transistor M2 inputs a high level, the transistor M2 is turned on; a first electrode of the transistor M1 may be a source electrode and is configured to be connected to the source line SL, for example, the transistor M1 may receive the reset voltage through the source line SL, and the first electrode of the transistor M2 may be the source electrode and configured to be connected to the source line SL, for example, the transistor M2 may receive the reset voltage through the source line SL, the first electrode of the transistor M1 is connected to the first electrode of the transistor M2, and the two electrodes are connected to the source line SL together. The second electrode of the transistor M1 may be a drain electrode and is configured to be connected to the second electrode (e.g., the negative electrode) of the memristor R1, and the first electrode (e.g., the positive electrode) of the memristor R1 is connected to the bit line BL1, for example, the memristor R1 may receive the setting voltage through the bit line BL1; the second electrode of the transistor M2 may be a drain electrode and is configured to be connected to the second electrode (e.g., the negative electrode) of the memristor R2, and the first electrode (e.g., the positive electrode) of the memristor R2 is connected to the bit line BL2, for example, memristor R2 may receive a setting voltage through the bit line BL2.

It should be noted that, the transistors M1 and M2 in the memristor unit of the 2T2R structure may also be P-type transistors, which will not be repeated here.

Figure 3:
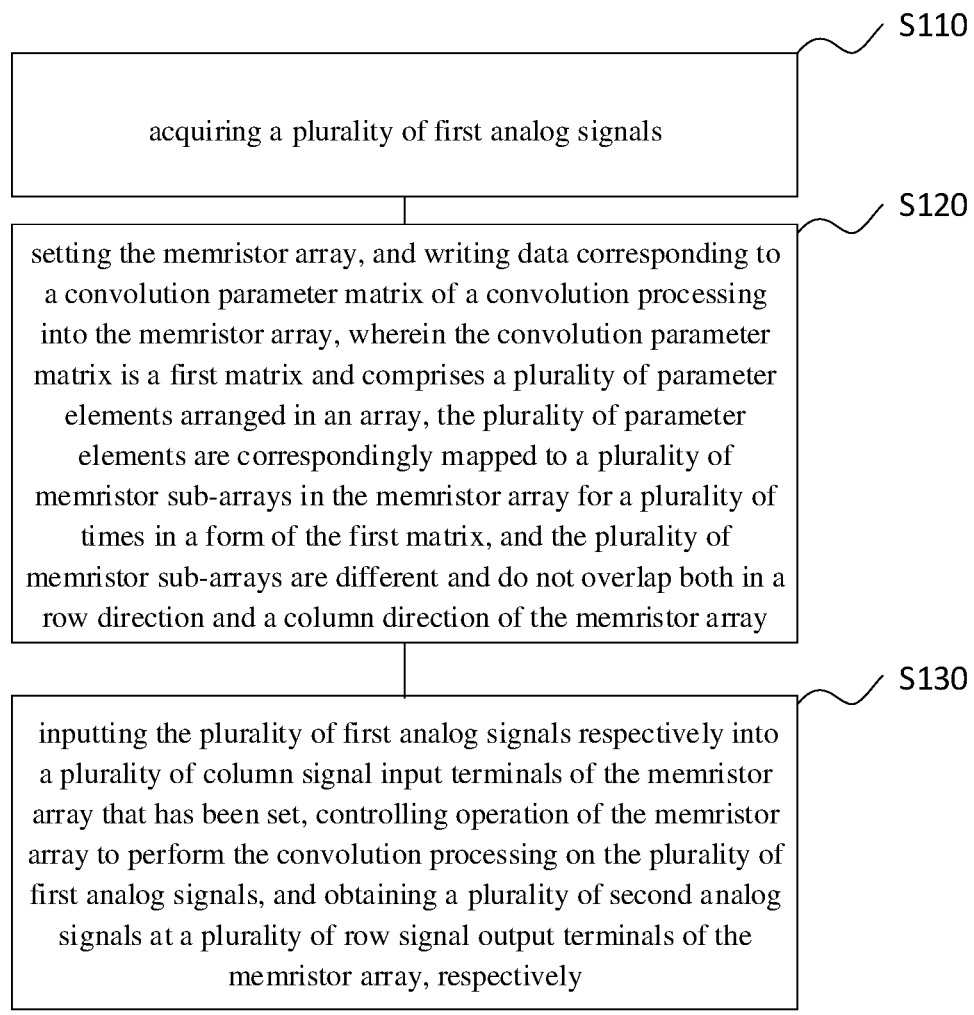
FIG. 3 is a schematic flowchart of a data processing method based on a memristor array provided by at least one embodiment of the present disclosure.

FIG. 3 is a schematic flowchart of a data processing method based on a memristor array provided by at least one embodiment of the present disclosure.

For example, as shown in FIG. 3, the data processing method based on the memristor array provided by the embodiment of the present disclosure includes steps S110 to S130, and the memristor array includes a plurality of memristor units arranged in an array and configured to be able to perform a multiply-accumulate operation (that is, accumulating the product results of the multiplication to obtain the accumulated sum value of the product results). For example, the schematic diagram of the structure of the memristor array is shown in FIG. 1, and each memristor unit may have a 1T1R structure as shown in FIG. 2A or a 2T2R structure as shown in FIG. 2B.

In step S110, acquiring a plurality of first analog signals.

In step S120, setting the memristor array, and writing data corresponding to a convolution parameter matrix of a convolution processing into the memristor array, wherein the convolution parameter matrix is a first matrix and comprises a plurality of parameter elements arranged in an array, the plurality of parameter elements are correspondingly mapped to a plurality of memristor sub-arrays in the memristor array for a plurality of times in a form of the first matrix, and the plurality of memristor sub-arrays are different and do not overlap both in a row direction and a column direction of the memristor array.

In step S130, inputting the plurality of first analog signals respectively into a plurality of column signal input terminals of the memristor array that has been set, controlling operation of the memristor array to perform the convolution processing on the plurality of first analog signals, and obtaining a plurality of second analog signals at a plurality of row signal output terminals of the memristor array, respectively.

For example, the plurality of first analog signals are input signals to be subjected to the convolution processing, and the plurality of second analog signals are output signals obtained by performing convolution processing on the input signals. For example, the first analog signal is an analog voltage signal, and the second analog signal is an analog current signal.

For example, the number of the plurality of second analog signals may be set according to calculation requirements. For example, the number of the plurality of second analog signals may be (N+Q−1), where N represents the number of the plurality of first analog signals, Q represents the number of columns of the convolution parameter matrix. Correspondingly, the number of rows of the memristor array may also be set correspondingly according to the number of the plurality of second analog signals. For example, the number of the plurality of second analog signals may also be obtained in other forms, which are not limited in the embodiments of the present disclosure.

For example, the convolution processing is used to filter the input signal, and each row of parameter elements in the convolution parameter matrix represents a filter coefficient vector. For example, the number of rows of the convolution parameter matrix is greater than or equal to 1. For example, the number of rows of the convolution parameter matrix is 1, the convolution parameter matrix represents a filter coefficient vector for performing specific filtering process.

For example, the filter used for the filtering process is a finite impulse response filter, for example, a plurality of finite impulse response filters may constitute a finite impulse response filter bank. The input-output relationship of the finite impulse response filter bank may be expressed by the following formula (1):

$$y^m(n)=\Sigma_{k=0}^{K}x(n-k)h^m(k), (m=1,2,\ldots,M) \quad (1)$$

In the above formula (1), m represents the serial number in the filter bank, M represents the total number of filters in the filter bank, K represents the filter order, x represents the input signal vector, y represents the output signal vector, $h^m(k)$ represents the filter coefficient vector of the m-th filter, and n may, for example, represent certain time.

For example, the convolution parameter matrix may represent a filter bank, that is, the convolution parameter matrix is composed of a plurality of filter coefficient vectors. For example, the number of rows of the convolution parameter matrix is at least one row, the parameter elements of each row represent a filter coefficient vector, and the parameter elements of different rows represent the filter coefficient vectors of different filters. For example, the parameter element of each row is $h'''(k)$ in formula (1).

For example, when the convolution parameter matrix is composed of a plurality of filter coefficient vectors, by using the feature that the memristor may perform multiply-accumulate operation, the input signals may be processed in parallel, not only can all the convolution results be obtained in one calculation cycle, but also the convolution results of different filters can be obtained at the same time, thus speeding up the processing speed and improving the calculation efficiency.

For example, when the signal to be convoluted is a digital signal, the digital signal needs to be converted into an analog signal through a digital-to-analog converter, and then calculated through the memristor array. At present, the full analog calculation based on the memristor array needs to convert the digital signal to be calculated into an analog signal many times as the input of the memristor, so this method also requires a large number of digital-to-analog conversions to complete a complete convolution processing.

For example, in some examples, step S110 may include: acquiring a plurality of initial digital signals; and performing digital-to-analog conversion processing on the plurality of initial digital signals to obtain the plurality of first analog signals respectively.

For example, the plurality of initial digital signals may be pre-stored digital signals; for example, the plurality of initial digital signals may be digital signals acquired in real time. Digital-to-analog conversion process is performed on the plurality of initial digital signals to obtain the plurality of first analog signals.

In the signal processing method provided by at least one embodiment of the present disclosure, the analog-to-digital conversion processing is performed only once, and the obtained first analog signals are input into the memristor array to obtain all the result values of the convolution processing, thus the conversion time caused by the analog-to-digital conversions is greatly reduced, and the calculation speed is further improved.

For example, in other examples, a plurality of first analog signals may be obtained by sampling consecutive analog signals.

For example, step S110 may include: acquiring an initial analog voltage signal, where the length of the initial analog voltage signal is a preset duration; adjusting the voltage value of the initial analog voltage signal to be within a preset voltage range to obtain an adjusted analog voltage signal; sampling the adjusted analog voltage signal at a preset sampling frequency to obtain the plurality of first analog signals that correspond to different moments within a preset time period, respectively.

For step S120, for example, each memristor sub-array corresponds to the first matrix, and different memristor sub-arrays respectively correspond to different column signal input terminals, and the plurality of parameter elements are correspondingly mapped to different memristor sub-arrays in the memristor array for a plurality of times in the form of the first matrix, which may include: sequentially selecting an object column group to be subjected to the convolution processing from the plurality of column signal input terminals, the object column group includes at least one column signal input terminal; for a selected object column group, correspondingly mapping the plurality of parameter elements into an object memristor sub-array in the form of the first matrix, and the object memristor sub-array is a memristor sub-array corresponding to the selected object column group among the plurality of memristor sub-arrays.

For example, each memristor sub-array comprises a plurality of target memristor units. For a selected object column group, correspondingly mapping the plurality of parameter elements into an object memristor sub-array in the form of the first matrix, comprises: mapping parameter elements of a same row in the first matrix to target memristor units of a same row in the object memristor sub-array; mapping parameter elements of a same column in the first matrix to target memristor units of a same column in the object memristor sub-array.

For example, each row of the convolution parameter matrix includes Q parameter elements, each memristor unit includes at least one memristor, and each memristor may be set to an initial state, for example, the initial state may be the high resistance state (low conductance state) of the memristor after initialization. For example, mapping parameter elements of a same row in the first matrix to target memristor units of a same row in the object memristor sub-array, includes: for each row of parameter elements of the convolution parameter matrix, selecting Q target memristor units from one row of memristor units corresponding to the object memristor sub-array in the memristor array to correspond to the Q parameters element one by one, and then setting memristors in memristor units other than the Q target memristor units in the one row of memristor units to the initial state, wherein Q is a positive integer greater than 1.

For example, selecting Q target memristor units from one row of memristor units corresponding to the object memristor sub-array in the memristor array to correspond to the Q parameters element one by one, includes: for each parameter element of the Q parameter elements, according to a numerical value of the parameter element, setting at least one memristor comprised in a target memristor unit corresponding to the parameter element in the Q target memristor units as a whole to a conductive state, so as to make the at least one memristor comprised in the target memristor unit available for calculation and have a conductance value corresponding to the numerical value.

According to the characteristics of the memristor described above, for example, the conductance value of the memristor may be changed by applying a setting voltage or a reset voltage to the memristor at the column signal input terminal (i.e., the bit line BL) and the row signal output terminal (i.e., the source line SL), thus each memristor may have a different conductance value, that is, the filter coefficient vector of the filter may be changed by changing the conductance value of the memristors, thereby designing a filter that meets the filtering requirements.

For example, each memristor unit may have a 1T1R structure, as shown in FIG. 2A, that is, each memristor unit includes one memristor, and the conductance value of the memristor represents the corresponding parameter element.

For example, each memristor unit may be a 2T2R structure, as shown in FIG. 2B, that is, each memristor unit includes two memristors. After acquiring the plurality of first analog signals, the method may further include: acquiring a plurality of inverted analog signals corresponding to the plurality of first analog signals, one of the two memristors is used to receive one of the first analog signals selected from the plurality of first analog signals, and the other memristor is used to receive an inverted analog signal corresponding to the one of the first analog signals that is selected.

For example, when the memristor unit is a 2T2R structure, the conductance values of the two memristors may be used to realize the negative value of the parameter element, so that more abundant and complex convolution processing may be realized by using the plurality of target memristor units.

For example, sequentially selecting an object column group to be subjected to the convolution processing from the plurality of column signal input terminals, includes: according to a convolution stride of the convolution processing, sequentially selecting the object column group to be subjected to the convolution processing from the plurality of column signal input terminals.

For example, for the convolution processing $y=x^T*W$, where "*" represents the convolution processing, x represents the input vector and is an N-dimensional column vector, and W represents the convolution parameter matrix with parameter elements arranged in P rows and M columns, then the convolution processing may also be rewritten as $y=x^T H$, where $H=[O_{11}, W; O_{21}, W, O_{22}; \ldots; W, O_{s1}]$, where H is a matrix with (N+M−1) rows and N columns, $O_a$ (a represents any subscript) represents a zero matrix, the number of rows of the zero matrix is P rows, and the number of columns of each zero matrix may be uniquely determined according to the requirements of the block matrix divided by the convolution parameter matrix W. Here, P, M, and N are all positive integers, and both M and N are greater than 1.

Figure 4:
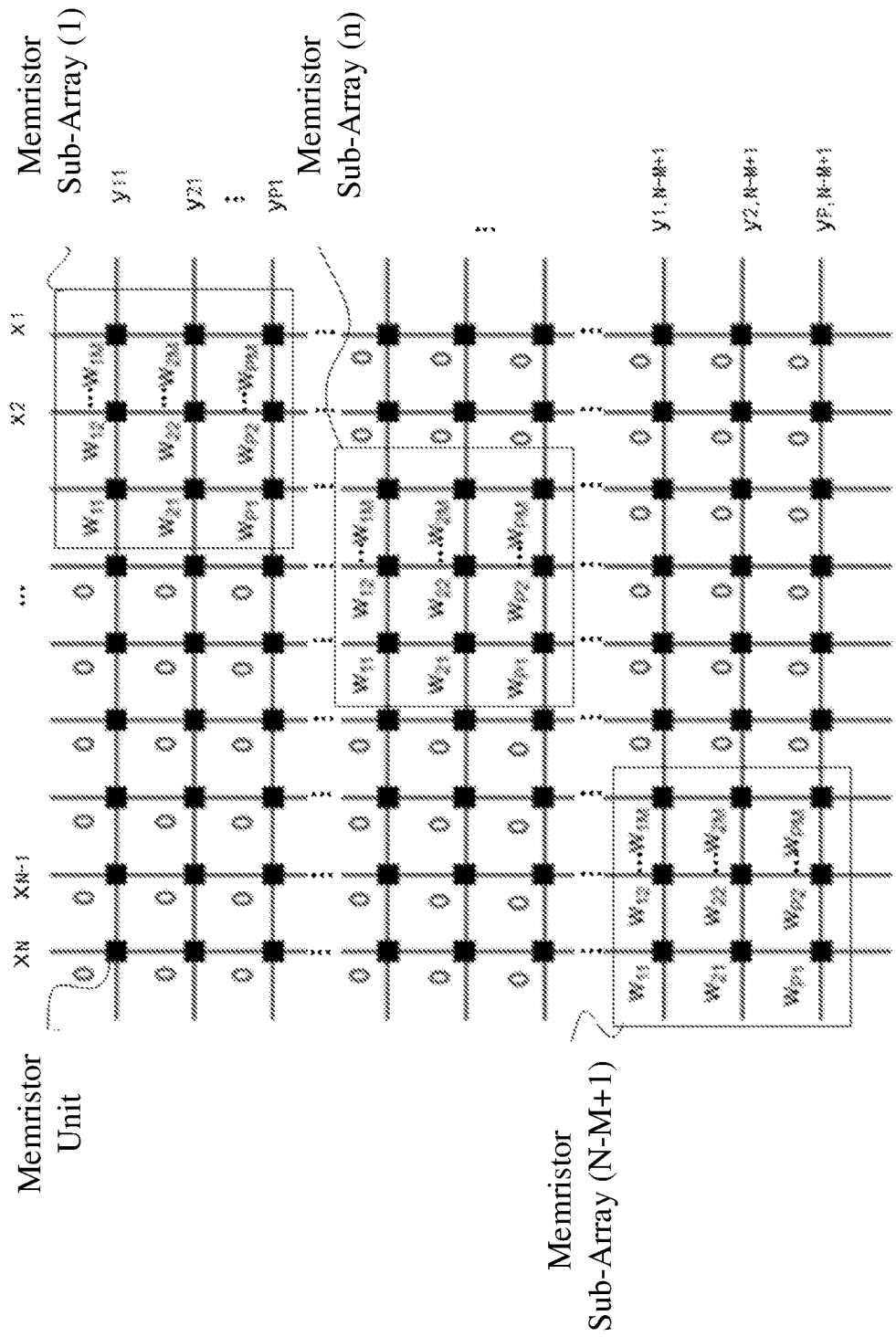
FIG. 4 is a schematic diagram of a memristor array after writing a convolution parameter matrix provided by at least one embodiment of the present disclosure.

FIG. 4 is a schematic diagram of a memristor array after writing a convolution parameter matrix provided by at least one embodiment of the present disclosure.

For example, the convolution processing is used for signal filtering processing, and the convolution parameter matrix is $W=[w_{11}, w_{12}, \ldots, w_{1M}; w_{21}, w_{22}, \ldots, w_{2M}; \ldots; w_{P1}, w_{P2}, \ldots, w_{PM}]$. The first row parameter elements $[w_{11}, w_{12}, \ldots, w_{1M}]$ in the convolution parameter matrix represent the filter coefficient vector(1), and the second row parameter elements $[w_{21}, w_{22}, \ldots, w_{2M}]$ in the convolution parameter matrix represent the filter coefficient vector (2), . . . , and the P-th row parameter elements $[w_{P1}, w_{P2}, \ldots, w_{PM}]$ in the convolution parameter matrix represent the filter coefficient vector(P).

For example, a memristor array may include (N+M−1) rows, N columns. The column signal input terminals of the memristor array respectively input N first analog signals, namely $x_1, x_2, x_3, \ldots, x_N$. The row signal output terminals of the memristor array respectively output (N+M−1) second analog signals, namely $y_1, y_2, y_3, \ldots, y_{N-M+1}$. The black square where the row and column lines meet represents a memristor unit. For example, a number "0" next to a memristor unit indicates that the memristor(s) included in memristor unit is/are in the initial state, and the mark "$w_{ij}$" next to the memristor unit indicates that the conductance value of the memristor unit is the value of the parameter element "$w_{ij}$", where i and j are both positive integers, i is less than or equal to P, and j is less than or equal to M.

As shown in FIG. 4, the convolution parameter matrix is mapped to the memristor sub-array (1), . . . , the memristor sub-array (n), . . . , the memristor sub-array (N−M+1), etc., so as to obtain the results $y_1, y_2, y_3, \ldots, y_{N-M+1}$ at the same time, and the results are acquired by performing the convolution processing on the N first analog signals, where n is a positive integer greater than 1 and less than (N−M+1).

For example, in combination with formula (1), the plurality of memristor sub-arrays correspond to different object column groups. For example, as shown in FIG. 4, the object column group corresponding to the memristor sub-array (1) includes M column signal input terminals, and the first analog signals input by the M column signal input terminals are respectively $x_1$ to $x_M$. That is to say, the column signal input terminals included in an object column group is the column signal input terminals of the memristor sub-array corresponding to that object column group.

For example, as shown in FIG. 4, the respective memristor sub-array do not overlap both in the row direction and the column direction of the memristor array. When the convolution stride of the convolution processing is a, the object column group to be subjected to the convolution processing is sequentially selected according to the convolution stride a. For example, the object column group (1) may be the first analog signals $x_1$ to $x_M$, the object column group (2) may be the first analog signals $x_a$ to $x_{a+M}$, and so on, so as to obtain the object column groups required for the convolution processing, where a is a positive integer.

For example, when the relative positional relationship of the plurality of first analog signals is shown in FIG. 4, from the upper left corner (or lower right corner) of the memristor array, each memristor sub-array moves to the left (or right) in turn by column a, here a=1. It should be noted that when the relative positional relationship of the plurality of first analog signals changes, the moving direction of the memristor sub-arrays also changes accordingly, which is not limited in the embodiments of the present disclosure.

For step S130, for example, the plurality of first analog signals may be respectively applied to the plurality of column signal input terminals of the memristor array that has been set according to the step S120, and the turn-on signals may be applied to a plurality of signal control terminals of the memristor array at the same time, a plurality of current signals output from the plurality of row signal output terminals of the memristor array are detected and acquired, and the plurality of second analog signals are obtained based on the plurality of current signals.

Figure 5A:
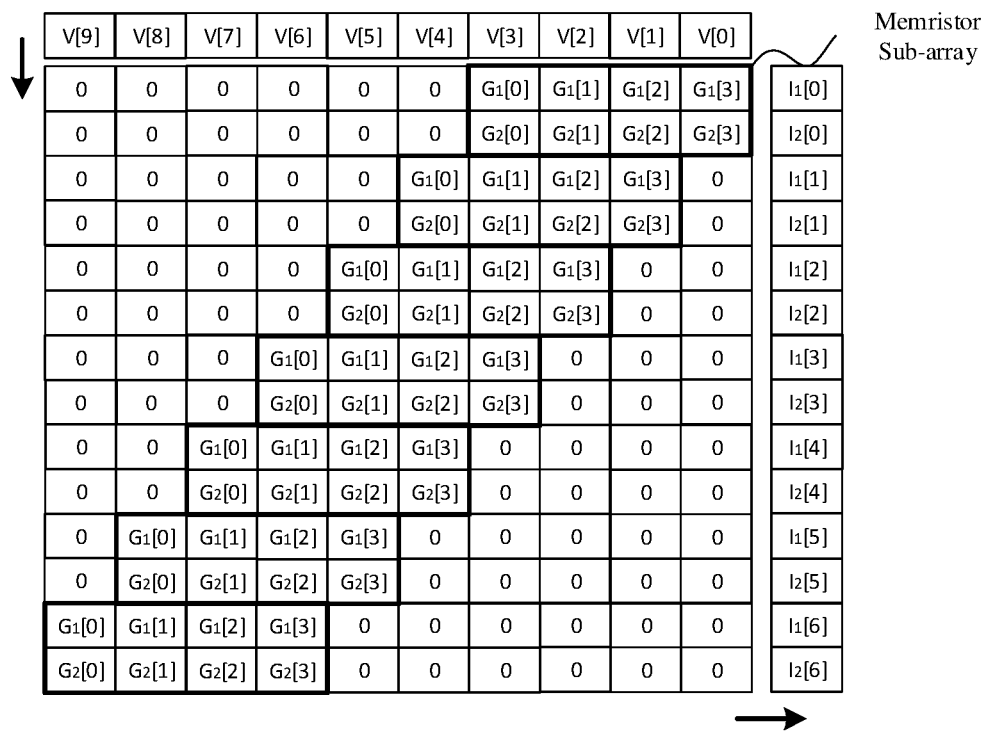
FIG. 5A is a schematic diagram of a memristor array after writing a convolution parameter matrix provided by at least one embodiment of the present disclosure.

FIG. 5A is a schematic diagram of a memristor array after writing a convolution parameter matrix provided by at least one embodiment of the present disclosure.

For example, the convolution parameter matrix $W=[W_1; W_2]=[G_1[0], G_1[1], G_1[2], G_1[3]; G_2[0], G_2[1], G_2[2], G_2[3]]$, that is, the first matrix is a matrix with parameter elements arranged in 2 rows and 4 columns, the row vector $W_1$ is the filter coefficient vector corresponding to the first filter, the row vector $W_2$ is the filter coefficient vector corresponding to the second filter, and $G_1[0]$ to $G_1[3]$ and $G_2[0]$ to $G_2[3]$ are parameter elements, respectively.

For example, as shown in FIG. 5A, the memristor array includes 14 rows and 10 columns, e.g., the memristor array is part of a larger memristor array. In the schematic diagram of the memristor array, each box represents a memristor unit, and the text in the box represents the overall conductance value of the memristor unit. For example, "0" means that the memristor(s) included in the memristor unit is/are in the initial state. For example, the memristor(s) included in the memristor unit may be reset to a high resistance state to be in the initial state, the resistance value of the memristor in the initial state is much larger than the resistance value of the memristor in the setting state. If the resistance value of the memristor in the initial state is considered to be infinite, the reciprocal of the resistance value corresponds to 0. For example, "$G_1[0]$" to "$G_1[3]$" and "$G_2[0]$" to "$G_2[3]$" indicate that the overall conductance value of the memristor unit is the value of the parameter element. Each memristor unit may be either a 1T1R structure or a 2T2R structure.

For example, V[0] to V[9] in FIG. 5A are 10 first analog signals, and V[0] to V[9] are input to 10 column signal input terminals, respectively, $I_1[0]$ to $I_1[6]$ and $I_2[0]$ to $I_2[6]$ in FIG. 5A are 14 second analog signals output by the 14 row signal output terminals, respectively.

For example, as shown in FIG. 5A, the memristor units with 2 rows and 4 columns defined by each thick solid frame is a memristor subarray, the plurality of memristor sub-arrays do not overlap both in the row direction and the column direction of the memristor array, and different memristor sub-arrays correspond to different column signal input terminals, respectively.

For example, selecting the first analog signal V[0] to the first analog signal V[3] as the object column group (1), the memristor sub-array located in the first row and the second row of the memristor array is the object memristor sub-array corresponding to the object column group (1), and the parameter elements $G_1[0]$ to $G_1[3]$ and $G_2[0]$ to $G_2[3]$ are mapped into the object memristor sub-array in the form of the first matrix.

For example, as shown in FIG. 5A, the parameter elements $G_1[0]$ to $G_1[3]$ are mapped to the 4 target memristor units in the first row (that is, the memristor units from row 1, column 7 to row 1, column 10 in the memristor array starting from the upper left corner). The 4 target memristor units correspond to the 4 parameter elements $G_1[0]$ to $G_1[3]$ one by one, and the memristors in the 6 memristor units other than the 4 target memristor units in the first row are set to the initial state, that is, "0" in row 1, column 1 to row 1, column 6 in FIG. 5A.

For example, the parameter elements $G_2[0]$ to $G_2[3]$ are mapped to the 4 target memristor units in the second row (that is, the memristor units from row 2, column 7 to row 2, column 10 in the memristor array starting from the upper left corner). The 4 target memristor units correspond to the 4 parameter elements $G_2[0]$ to $G_2[3]$ one by one, and the memristors in the 6 memristor units other than the 4 target memristor units in the second row are set to the initial state, that is, "0" in row 2, column 1 to row 2, column 6 in FIG. 5A.

For example, selecting the first analog signal V[1] to the first analog signal V[4] as the object column group (2), the memristor sub-array located in the third row and the fourth row of the memristor array is the object memristor sub-array corresponding to the object column group (2), and the parameter elements $G_1[0]$ to $G_1[3]$ and $G_2[0]$ to $G_2[3]$ are mapped into the object memristor sub-array in the form of the first matrix. The specific mapping process is as mentioned above, which will not be repeated here.

For example, selecting the first analog signal V[2] to the first analog signal V[5] as the object column group (3), the memristor sub-array located in the fifth row and the sixth row of the memristor array is the object memristor sub-array corresponding to the object column group (3), and the parameter elements $G_1[0]$ to $G_1[3]$ and $G_2[0]$ to $G_2[3]$ are mapped into the object memristor sub-array in the form of the first matrix. The specific mapping process is as mentioned above, which will not be repeated here.

By analogy, the parameter elements G1[0] to G1[3] and G2[0] to G2[3] are respectively mapped to different memristor sub-arrays in the form of the first matrix, so as to obtain the memristor array as shown in FIG. 5A.

For example, inputting 10 first analog signals to the plurality of column signal input terminals of the memristor array that has been set respectively, and controlling the operation of the memristor array to perform convolution processing on the plurality of first analog signals. According to Kirchhoffs law, the output currents of the memristor array may be obtained according to the following formula (2):

$$I_j = \Sigma_{k=1}^{N} G_{jk} V_k \qquad (2)$$

where j=1, ..., M, k=1, ..., N.

In the above formula (2), $V_k$ represents the voltage input at the k-th column signal input terminal among the plurality of column signal input terminals, $I_j$ represents the current signal output by the j-th row signal output terminal among the plurality of row signal output terminals. $G_{jk}$ represents the overall conductance value of the memristor unit located at the j-th row and the k-th column. According to Kirchhoffs law, the memristor array may complete the multiply-accumulate operation in parallel.

For example, for the second analog signal $I_1[0]$ output by the first row signal output terminal in FIG. 5A, combined with formula (2), it can be obtained that $I_1[0]=V[3]*G_1[0]+V[2]*G_1[1]+V[1]*G_1[2]+V[0]*G_1[3]$. With reference to formula (1), it can be seen that the second analog signal $I_1[0]$ is a convolution result obtained by performing convolution processing on the four first analog signals in the object column group (1).

For example, for the second analog signal $I_1[1]$ output by the third row signal output terminal in FIG. 5A, combined with formula (2), it can be obtained that $I_1[1]=V[4]*G_1[0]+V[3]*G_1[1]+V[2]*G_1[2]+V[1]*G_1[3]$. With reference to formula (1), it can be seen that the second analog signal $I_1[1]$ is a convolution result obtained by performing convolution processing on the four first analog signals in the object column group (2).

By analogy, after performing convolution processing, 14 second analog signals are obtained at the 14 row signal output terminals of the memristor array, respectively, that is, $I_1[0]$ to $I_1[6]$ and $I_2[0]$ to $I_2[6]$ in FIG. 5A. Among them, $I_1[0]$ to $I_1[6]$ are seven convolution processing results corresponding to the first filter, and $I_2[0]$ to $I_2[6]$ are seven convolution processing results corresponding to the second filter.

Figure 5B:
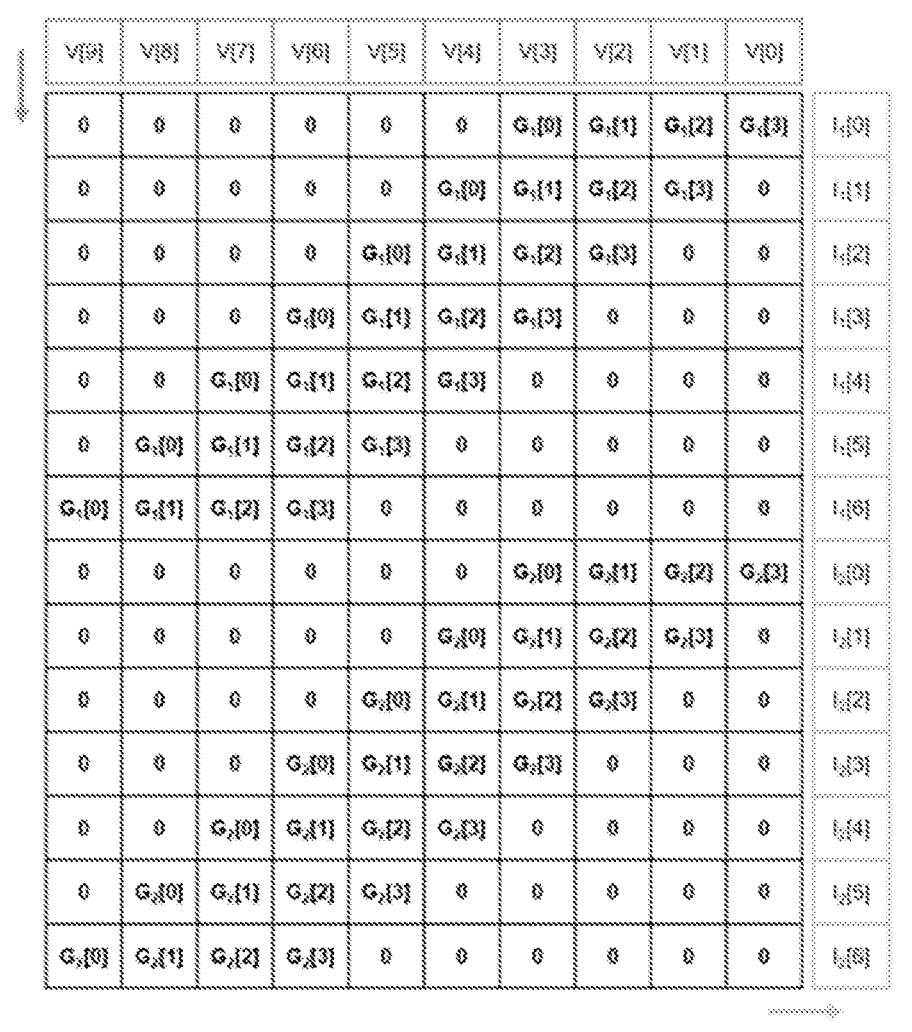

FIG. 5B is a schematic diagram of another memristor array after writing a convolution parameter matrix provided by at least one embodiment of the present disclosure, this embodiment may implement the same convolution calculation as the embodiment shown in FIG. 5A.

For example, the definitions of the memristor array, the convolution parameter matrix, the 10 first analog signals, and the object column groups shown in FIG. 5B are exactly the same as those shown in FIG. 5A, which will not be repeated here.

For example, taking the memristor unit in the upper left corner of the memristor array as the memristor unit in the first row and first column, the object memristor array corresponding to the object column group (1) is the 4 target memristor units located from row 1, column 7 to row 1, column 10 of the memristor array, and the 4 target memristor units located from row 8, column 7 to row 8, column 10 of the memristor array. Although the parameter elements G1[0] to G1[3] and G2[0] to G2[3] are arranged separately in two rows that are no longer directly adjacent, they still form a memristor sub-array. Similarly, the object memristor array corresponding to the object column group (2) is the 4 target memristor units located from row 2, column 6 to row 2, column 9 of the memristor array, and the 4 target memristor units located from row 9, column 6 to row 9, column 9 of the memristor array, and the object memristor arrays corresponding to other object column groups will not be repeated here.

For example, each row of parameter elements includes Q parameter elements. For each row of parameter elements of the convolution parameter matrix, such as the first row of parameter elements $G_1[0]$ to $G_1[3]$ or the second row of parameter elements $G_2[0]$ to $G_2[3]$, mapping each row of parameter elements to a plurality of memristor rows in the memristor array, the Q target memristor units included in each memristor row correspond to the Q parameter elements one by one. For example, mapping the first row of parameter elements to the first to seventh rows in the memristor array, and mapping the second row of parameter elements to the eighth to fourteenth rows in the memristor array. For example, as shown in FIG. 5B, for the first to seventh rows in the memristor array, each memristor row includes 4 target memristor units, and the 4 target memristor units have one-to-one correspondence to the 4 parameter elements $G_1[0]$ to $G_1[3]$. For the eighth to fourteenth rows of the memristor array, each memristor row includes 4 target memristor units, and these 4 target memristor units correspond to 4 parameter elements $G_2[0]$ to $G_2[3]$ one by one.

For example, as shown in FIG. 5A and FIG. 5B, the size of the memristor sub-array is the same as the size of the convolution parameter matrix. For example, the convolution parameter matrix is in the form of a first matrix with P rows and Q columns, and the memristor sub-array also includes P rows and Q columns of target memristor units.

It should be noted that, in the present disclosure, a memristor row in the memristor array uniquely corresponds to a row of parameter elements in the convolution parameter matrix, the present disclosure does not limit the positional relationship between target memristor units in each row of memristor sub-arrays and the positional relationship between target memristor units in each memristor row.

For example, as shown in FIG. 5A and FIG. 5B, each row of target memristor units in the memristor sub-array may be a plurality of target memristor units that are consecutive and adjacent to each other. For example, according to the change of the relative positional relationship between the plurality of first analog signals, each row of target memristor units in the memristor sub-array may also be a plurality of discontinuous target memristor units, which is not limited in the present disclosure.

For example, when the memristor sub-array includes a plurality of rows of target memristor units, each row of target memristor units in the memristor sub-array is not limited to the adjacent form. For example, as shown in FIG. 5A, the two rows of target memristor units in each memristor sub-array are adjacent to each other, alternatively, as shown in FIG. 5B, the two rows of target memristor units in each memristor sub-array are not adjacent to each other, which is not limited in the present disclosure.

For example, the value of a parameter element may be positive or negative. For example, each parameter element may be represented by the conductance values of two memristors. For example, a parameter element is represented by the difference between the conductance values of two memristors, or a parameter element is represented by the sum of the conductance values of the two memristors.

For example, the convolution parameter matrix is a first matrix arranged in 2*P rows and Q columns. The convolution parameter matrix includes a first sub-convolution parameter matrix with P rows and Q columns and a corresponding second sub-convolution parameter matrix with P rows and Q columns, a parameter element in the first sub-convolution parameter matrix and a parameter element of a position with a corresponding row and column in the second sub-convolution parameter matrix collectively represent a parameter element for performing the convolution processing, wherein P is a positive integer greater than or equal to 1, and Q is a positive integer greater than 1. For example, "corresponding row and column" indicates that corresponding position in the row direction and column direction in the first sub-convolution parameter matrix and the second sub-convolution parameter matrix. For example, the parameter element 1 is located in row 1 and column 1 in the first sub-convolution parameter matrix, parameter element 1' is located row 1 and column 1 in the second sub-convolution parameter matrix, parameter element 1 and parameter element 1' collectively represent a parameter element for performing the convolution processing.

At this time, for step S130, for example, the first sub-convolution parameter matrix includes P rows of first parameter elements, the second sub-convolution parameter matrix includes P rows of second parameter elements, and row and column positions of the P rows of first parameter elements and the P rows of second parameter elements are in one-to-one correspondence. For example, obtaining a plurality of second analog signals after performing the convolution processing respectively at a plurality of row signal output terminals of the memristor array, includes: for each memristor sub-array, determining at least one group of rows to be processed, wherein each group of rows to be processed comprises one row of target memristor units corresponding to one row of first parameter elements, and one row of target memristor units corresponding to one row of second parameter elements, wherein the one row of second parameter elements corresponds to the one row of first parameter elements; performing current preprocessing on current signals of two row signal output terminals corresponding to two rows of target memristor units comprised in each group of rows to be processed, to obtain a second analog signal corresponding to each group of rows to be processed.

For example, the current preprocessing is current subtraction processing or current addition processing.

For example, the convolution parameter matrix $W'=[W^+; W^-]=[G_+[0], G_+[1], G_+[2], G_+[3]; G_-[0], G_-[1], G_-[2], G_-[3]]$, the first matrix is a matrix with parameter elements arranged in 2 rows and 4 columns, and the row vector $W^+$ is the first sub-convolution parameter matrix, the first sub-convolution parameter matrix includes a row of first parameter elements $(G_+[0], G_+[1], G_+[2], G_+[3])$, and the row vector $W^-$ is the second sub-convolution parameter matrix, the second sub-convolution parameter matrix includes a row of second parameter elements $(G_-[0], G_-[1], G_-[2], G_-[3])$.

The parameter element $G_+[0]$ and the parameter element $G_-[0]$ together represent the parameter element $G[0]$ that performs the convolution processing, the parameter element $G_+[1]$ and the parameter element $G_-[1]$ collectively represent the parameter element $G[1]$ that performs the convolution processing, the parameter element $G_+[2]$ and the parameter element $G_-[2]$ collectively represent the parameter element $G[2]$ that performs the convolution processing, and the parameter element $G_+[3]$ and the parameter element $G_-[3]$ collectively represent the parameter element $G[3]$ that performs the convolution processing, that is, the filter coefficient vector for performing convolution processing is $(G[0], G[1], G[2], G[3])$. The filter coefficient vector is collectively represented by the first sub-convolution parameter matrix and the corresponding second sub-convolution parameter matrix, thus the first sub-convolution parameter matrix and the corresponding second sub-convolution parameter matrix may be used to realize the negative value of the parameter element, so as to perform more abundant and complex convolution processing.

Figure 6:
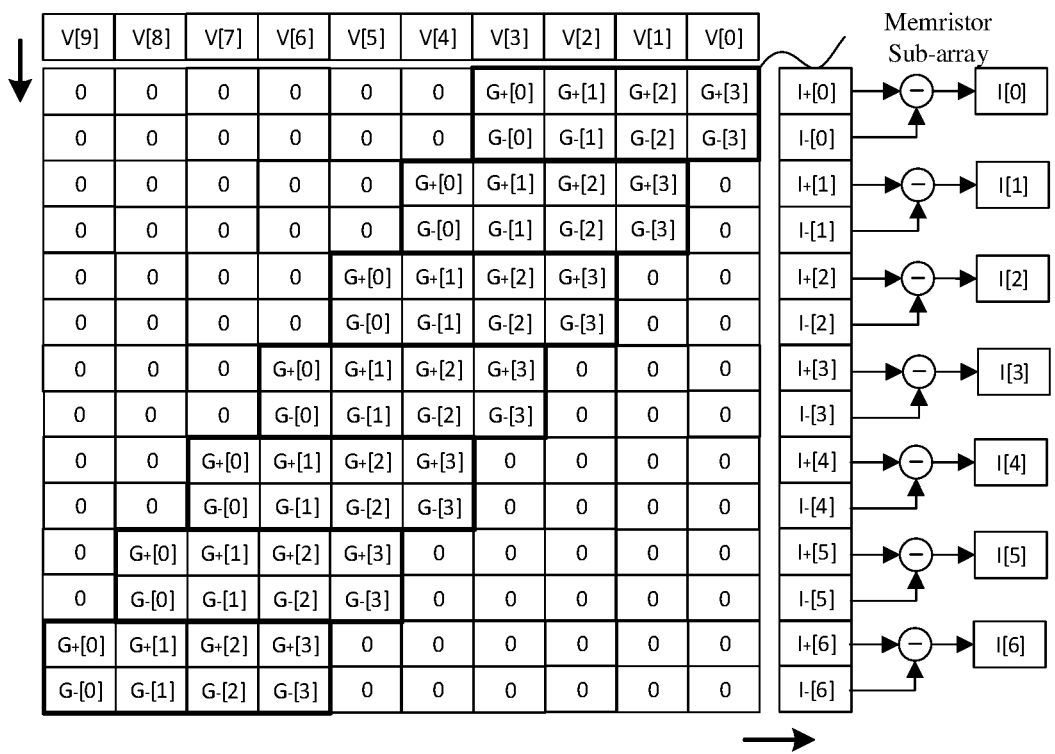
FIG. 6 is a schematic diagram of still another memristor array after writing a convolution parameter matrix provided by at least one embodiment of the present disclosure.

FIG. 6 is a schematic diagram of yet another memristor array after writing a convolution parameter matrix provided by at least one embodiment of the present disclosure.

For example, V[0] to V[9] in FIG. 6 are 10 first analog signals, which are respectively input to 10 column signal input terminals, $I_+[0]$ to $I_+[6]$ and $I_-[0]$ to $I_-[6]$ in FIG. 6 are the 14 current signals output by the 14 row signal output terminals, respectively. Seven second analog signals I[0] to I[6] are obtained based on the 14 current signals.

For example, the convolution parameter matrix W' is mapped to different plurality of memristor sub-arrays in the memristor array for a plurality of times in the form of the first matrix, each memristor sub-array is shown in the region marked by the black thick solid line in FIG. 6 to obtain the memristor array shown in FIG. 6, the convolution parameter matrix W' corresponding to each memristor sub-array is a substantially convolution parameter matrix with 1 row and 4 columns after the operation, and the specific process is as described above and will not be repeated here.

For example, each parameter element for performing the convolution processing is represented by the difference between the parameter elements at the corresponding row and column positions in the first sub-convolution parameter matrix $W^+$ and the second sub-convolution parameter matrix $W^-$.

For example, for the memristor sub-array (1) marked by the black thick solid box located in the first and second row in the memristor array, a group of rows to be processed corresponding to the memristor sub-array (1) includes one row of target memristor units in the first row and one row of target memristor units in the second row of the memristor array. For example, subtracting the current signal $I_+[0]$ at the row signal output terminal of the first row and the current signal $I_-[0]$ at the row signal output terminal of the second row in the memristor array to obtain the second analog signal I[0].

For example, for the memristor sub-array (2) marked by the black thick solid box located in the third and fourth row in the memristor array, a group of rows to be processed corresponding to the memristor sub-array (2) includes one row of target memristor units in the third row and one row of target memristor units in the fourth row of the memristor array. For example, subtracting the current signal $I_+[1]$ at the row signal output terminal of the third row and the current signal $I_-[1]$ at the row signal output terminal of the fourth row in the memristor array to obtain the second analog signal I[1].

By analogy, the second analog signal I[2] to the second analog signal [6] are obtained in the above manner to obtain seven second analog signals after convolution processing.

For example, the first memristor array and second memristor array that are correspondingly set may also be used, and the current signals at the corresponding row signal output terminals may be preprocessed to obtain the second analog signal, so as to realize the negative value of the parameter element and perform more abundant and complex convolution processing.

For example, the memristor array includes a first memristor array and a second memristor array, the convolution parameter matrix includes a first sub-convolution parameter matrix and a second sub-convolution parameter matrix, the first sub-convolution parameter matrix and the second sub-convolution parameter matrix are in the form of the first matrix, the first sub-convolution parameter matrix is correspondingly mapped to different memristor sub-arrays in the first memristor array for a plurality of times in the form of the first matrix, the second sub-convolution parameter matrix is correspondingly mapped to different memristor sub-arrays in the second memristor array for a plurality of times in the form of the first matrix.

At this time, for step S130, for example, obtaining a plurality of second analog signals after performing the convolution processing respectively at a plurality of row signal output terminals of the memristor array, includes: performing current preprocessing on a current signal of each row signal output terminal in the first memristor array and a current signal of a corresponding row signal output terminal in the second memristor array, to obtain the plurality of second analog signals.

For example, the current preprocessing is current subtraction processing or current addition processing.

For example, the convolution parameter matrix $W'=[W^+; W^-]=[G_+[0], G_+[1], G_+[2], G_+[3]; G_-[0], G_-[1], G_-[2], G_-[3]]$, the first matrix is a matrix in which parameter elements are arranged in 1 row and 4 columns, that is, a 4-dimensional row vector. The row vector $W^+$ is the first sub-convolution parameter matrix, the row vector $W^-$ is the second sub-convolution parameter matrix, and both the first sub-convolution parameter matrix and the second sub-convolution parameter matrix are in the form of first matrices.

Similarly, a parameter element in the first sub-convolution parameter matrix and a parameter element of a position with a corresponding row and column in the second sub-convolution parameter matrix collectively represent a parameter element for performing the convolution processing. For example, the parameter element $G_+[0]$ and the parameter element $G_-[0]$ collectively represent the parameter element G[0] that performs the convolution processing, the parameter element $G_+[1]$ and the parameter element $G_-[1]$ collectively represent the parameter element G[1] that performs the convolution processing, the parameter element $G_+[2]$ and the parameter element $G_-[2]$ collectively represent the parameter element G[2] that performs the convolution processing, the parameter element $G_+[3]$ and the parameter element $G_-[3]$ collectively represent the parameter element G[3] that performs the convolution processing. That is to say, the filter coefficient vector for performing convolution processing is (G[0], G[1], G[2], G[3]). The filter coefficient vector is collectively represented by the first sub-convolution parameter matrix and the corresponding second sub-convolution parameter matrix, thus the first sub-convolution parameter matrix and the corresponding second sub-convolution parameter matrix may be used to realize the negative value of the parameter element, so as to perform more abundant and complex convolution processing.

Figure 7:
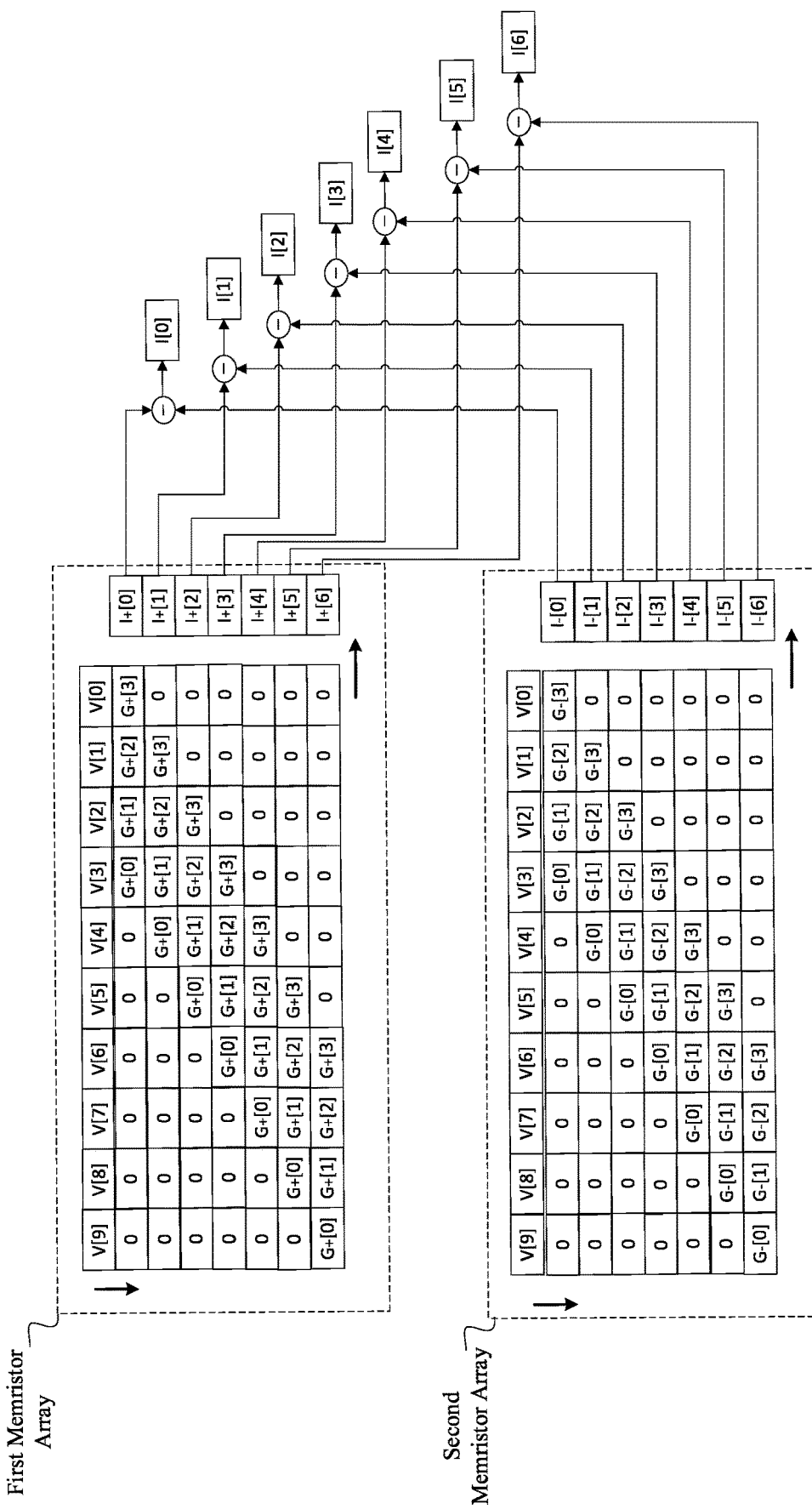
FIG. 7 is a schematic diagram of still another memristor array after writing a convolution parameter matrix provided by at least one embodiment of the present disclosure.

FIG. 7 is a schematic diagram of yet another memristor array after writing a convolution parameter matrix provided by at least one embodiment of the present disclosure.

The memristor array shown in FIG. 7 includes a first memristor array and a second memristor array, each memristor array has an independent control circuit, for example, independent column signal input terminals to input 10 first analog signals V[0] to V[9] respectively, and independent row signal outputs to output the current signal $I_+[0]$ to the current signal $I_+[6]$ and the current signal $I_-[0]$ to the current signal $I_-[6]$. For example, I[0] to I[6] in FIG. 7 represent seven second analog signals after performing convolution processing.

For example, the first sub-convolution parameter matrix $W^+$ in the convolution parameter matrix W' is mapped to different memristor sub-arrays in the first memristor array for a plurality of times in the form of the first matrix, the second sub-convolution parameter matrix $W^-$ in the convolution parameter matrix W' is mapped to different memristor sub-arrays in the second memristor array for a plurality of times in the form of the first matrix, so as to obtain the memristor array shown in FIG. 7. The specific process is as described above and will not be repeated here.

For example, each parameter element for performing the convolution processing is represented by the difference between the parameter element in the first sub-convolution parameter matrix $W^+$ and the parameter element of a corresponding row and column position in the second sub-convolution parameter matrix $W^-$.

For example, subtracting the current signal $I_+[0]$ at the row signal output terminal of the first row in the first memristor array and the current signal $I_-[0]$ at the row signal output terminal of the first row in the second memristor array to obtain the second analog signal I[0].

For example, subtracting the current signal $I_+[1]$ at the row signal output terminal of the second row in the first memristor array and the current signal $I_-[1]$ at the row signal output terminal of the second row in the second memristor array to obtain the second analog signal I[1].

By analogy, as shown in FIG. 7, the second analog signal I[2] to the second analog signal [6] are obtained in the above manner, so as to obtain seven second analog signals after performing convolution processing.

For example, the data processing method based on a memristor array provided by at least one embodiment of the present disclosure may further include: performing an analog-to-digital conversion processing on the plurality of second analog signals to convert the plurality of second analog signals into a plurality of digital signals for subsequent processing.

Figure 8:
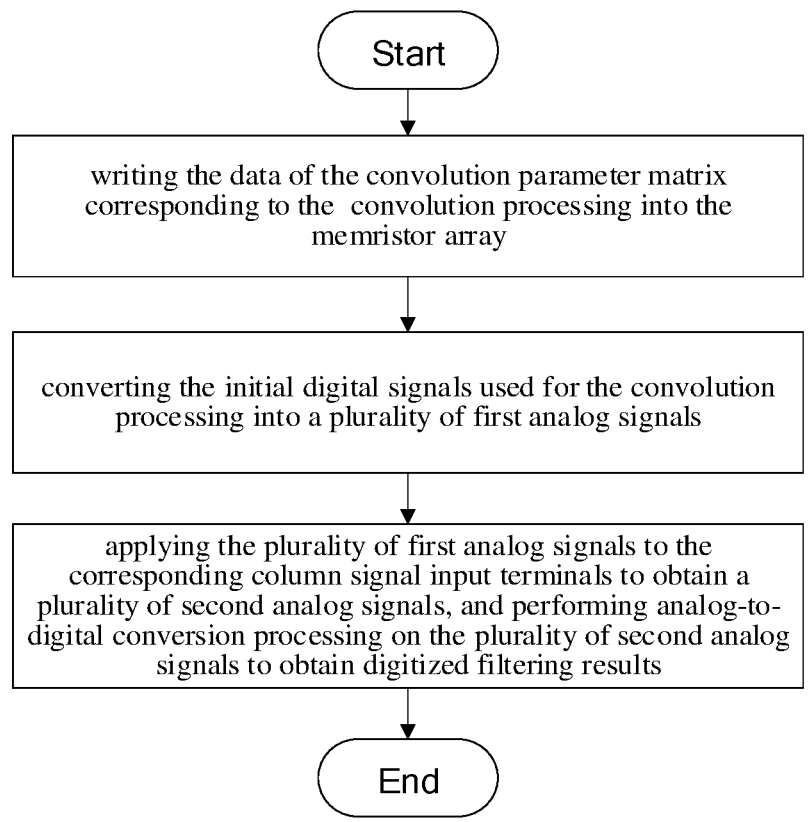
FIG. 8 is a schematic diagram of a processing flow of a data processing method based on a memristor array provided by at least one embodiment of the present disclosure.

For example, FIG. 8 is a schematic diagram of a processing flow of a data processing method based on a memristor array provided by at least one embodiment of the present disclosure.

The execution process of the data processing method based on the memristor array will be described in detail below with reference to FIG. 8.

First, as shown in FIG. 8, the data corresponding to the convolution parameter matrix of the convolution processing is written into the memristor array, and the specific process is as described in step S120, which will not be repeated here.

Next, the initial digital signals used for convolution processing are converted into a plurality of first analog signals, where the first analog signals are analog voltage signals, and the specific process is as described in step S110, which will not be repeated here.

Finally, a plurality of first analog signals are applied to the corresponding column signal input terminals to obtain a plurality of second analog signals, and analog-to-digital conversion processing is performed on the plurality of second analog signals to obtain digitized filtering results. The specific process is as described in step S130, which is not repeated here.

The data processing method based on the memristor array can achieve getting all the results of convolution processing operation in one calculation (or one calculation period), thereby greatly reducing the number and time of analog-to-digital conversion in the process of data shifting and acquiring the first analog signals, reducing power consumption and improving the calculation speed.

For example, the data processing method based on the memristor array provided by the present disclosure may be used for the analysis of neural signals, for example, it may be used in intracranial system design to process the acquired initial neural signals, such as feature extraction, etc., which further reduces the power consumption of the convolution processing, improves the operation speed, and meets the strict power consumption and area requirements of the intracranial system design.

For example, the initial nerve signal may be a cranial nerve signal, a spinal nerve signal, etc., and the initial nerve signal includes but is not limited to nerve signals of various animals.

For example, when the convolution parameter matrix includes a plurality of filter coefficient vectors, each filter coefficient vector is used to extract different feature information, thus the memristor array may be used to extract different features from initial neural signals in parallel, so as to obtain second analog signals, that is, feature information, thereby improving computational efficiency and reducing power consumption.

Figure 9A:
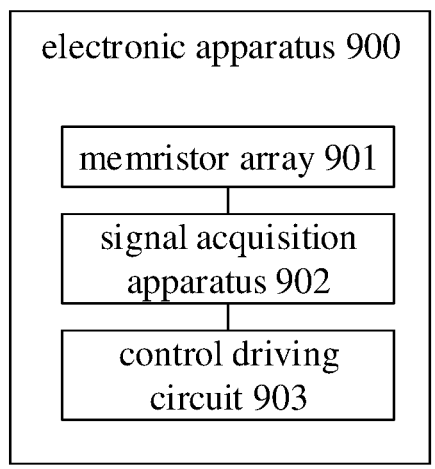
FIG. 9A is a schematic block diagram of an electronic apparatus provided by at least one embodiment of the present disclosure.

Corresponding to the above-mentioned data processing method based on the memristor array, at least one embodiment of the present disclosure further provides an electronic apparatus. FIG. 9A is a schematic block diagram of an electronic apparatus provided by at least one embodiment of the present disclosure.

As shown in FIG. 9A, the electronic apparatus 900 includes a memristor array 901, a signal acquisition apparatus 902 and a control driving circuit 903. The memristor array 901 is configured to perform multiply-accumulate operation to perform convolution processing as described above. The signal acquisition apparatus 902 is configured to acquire a plurality of first analog signals. The control driving circuit 903 is configured to perform step S120 and step S130.

For example, the memristor array 901 may use the memristor array shown in FIG. 1, and the memristor array includes a plurality of memristor units arranged in an array, for example, the memristor array includes m rows and n columns. For example, each memristor unit includes a memristor, each memristor includes a first terminal and a second terminal, and the memristor may be set to an initial state and may also be set to a setting state with a certain resistance value. When the memristor is in the initial state, its resistance value is much greater than when it is in the setting state. For example, each memristor unit also includes a switching element, the switching element includes a control terminal, a first electrode and a second electrode, the first terminal of the memristor is electrically connected to the first electrode of the switching element.

For example, the memristor array also includes m word lines, m source lines, and n bit lines. The m word lines correspond to m rows respectively, each word line is electrically connected to the control terminals of each switching element of one row of memristor units. The m source lines correspond to m rows respectively, and each source line is electrically connected to the second electrode of each switching element of one row of memristor units. The n bit lines correspond to n columns respectively, and each bit line is electrically connected to the second terminal of each memristor of one column of memristor units.

For example, the signal acquisition apparatus 902 includes a digital signal acquisition circuit and a digital-to-analog conversion circuit. For example, the digital signal acquisition circuit is configured to acquire a plurality of initial digital signals; the digital-to-analog conversion circuit is configured to perform digital-to-analog conversion processing on the plurality of initial digital signals to obtain the plurality of first analog signals respectively.

For example, the control driving circuit 903 may include a source line driving circuit, a word line driving circuit, and a bit line driving circuit. The source line driving circuit is configured to detect the plurality of second analog signals and perform initialization operation on the memristor array; the word line driving circuit is configured to apply turn-on signals to the plurality of signal control terminals of the memristor array and perform initialization operation on the memristor array; the bit line driving circuit is configured to apply input signals to the plurality of column signal input terminals and perform initialization operation on the memristor array, and the input signals at least includes the plurality of first analog signals.

For example, the control driving circuit 903 may apply input signals to a plurality of column signal input terminals of the memristor array through the bit line driving circuit, the turn-on signals are simultaneously applied to a plurality of signal control terminals of the memristor array through the word line drive circuit, finally the current signals of the plurality of row signal output terminals of the set memristor array are processed by the source line driving circuit to obtain a plurality of second analog signals.

For example, the electronic apparatus 900 may further include a data output circuit, where the data output circuit is configured to convert the plurality of second analog signals into digital signals, so as to respectively convert the plurality of second analog signals into a plurality of digital signals for subsequent processing.

It should be noted that, for a specific description of acquiring a plurality of first analog signals by the signal acquiring apparatus 902, reference may be made to the relevant description of step S110 shown in FIG. 3 in the above-mentioned embodiment of the data processing method based on the memristor array; the control driving circuit 903 is used to implement step S120 and step S130 shown in FIG. 3, for the specific description of the control driving circuit 903, reference may be made to the relevant descriptions of step S120 and step S130 shown in FIG. 3 in the above-mentioned embodiment of the data processing method based on the memristor array. In addition, the electronic apparatus can achieve similar technical effects as the aforementioned data processing method based on the memristor array, which is not repeated here.

Figure 9B:
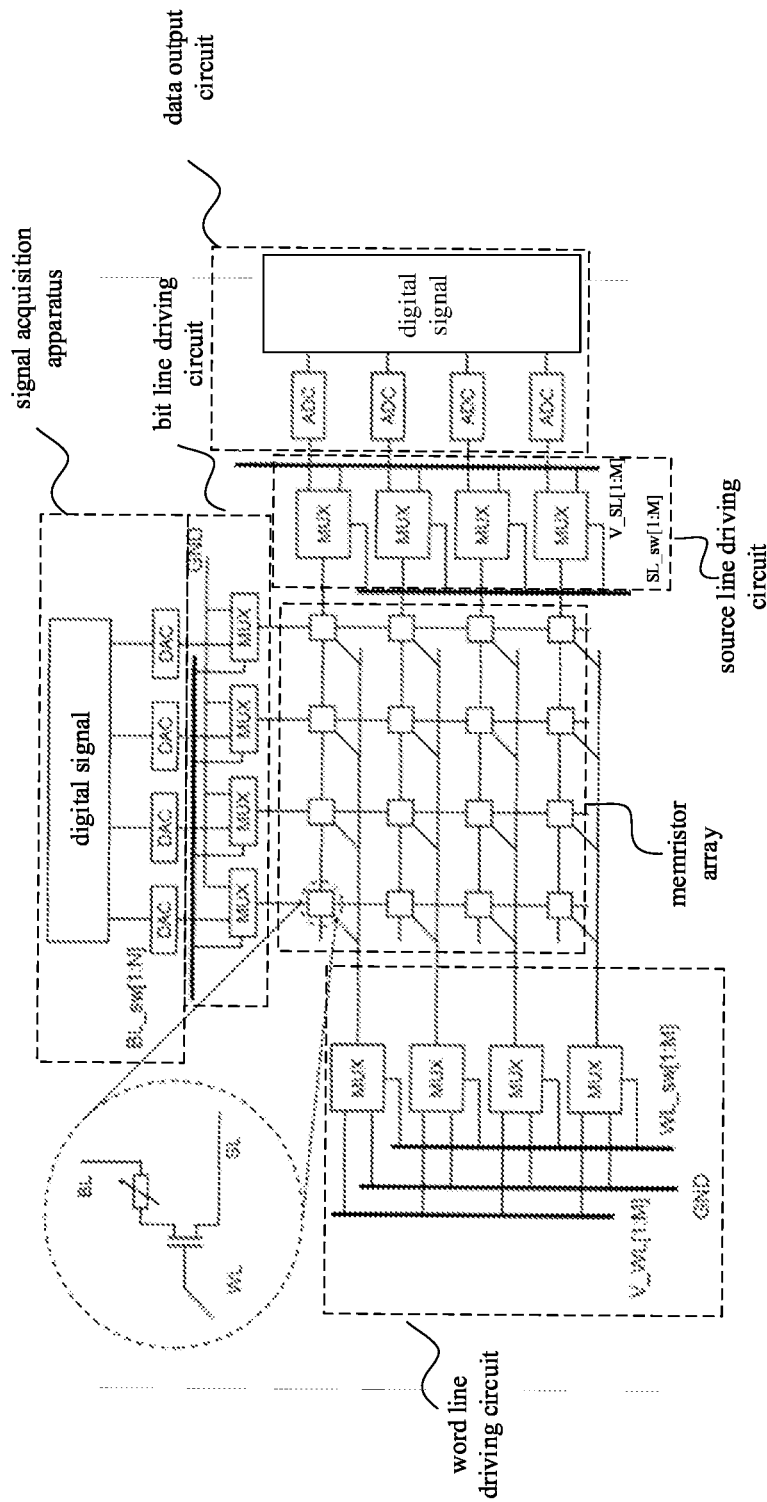
FIG. 9B is a schematic diagram of an electronic apparatus provided by at least one embodiment of the present disclosure.

FIG. 9B is a schematic diagram of an electronic apparatus provided by at least one embodiment of the present disclosure. For example, as shown in FIG. 9B, the electronic apparatus includes a signal acquisition apparatus, a word line driving circuit, a bit line driving circuit, a source line driving circuit, a memristor array, and a data output circuit For example, the signal acquisition apparatus is configured to convert digital signals into a plurality of first analog signals through a DAC (Digital to Analog converter), so as to input the first analog signals to a plurality of column signal input terminals of the memristor array during the convolution processing.

For example, a memristor array includes M source lines, M word lines, and N bit lines, and a plurality of memristor units arranged in an array with M rows and N columns. For example, each memristor unit is a 1T1R structure, and the convolution parameter matrix used for convolution processing is mapped to different memristor sub-arrays in the memristor array for a plurality of times. The specific process is as described in step S120, which will not be repeated here.

For example, the process of realizing the convolution processing by the word line driving circuit, the bit line driving circuit and the source line driving circuit is as described above, which will not be repeated here.

For example, the word line driving circuit includes a plurality of multiplexers (Mux for short) for switching the input voltage of the word line, the bit line driving circuit includes a plurality of multiplexers for switching the bit line input voltage, the source line driving circuit also includes a plurality of multiplexers for switching the source line input voltage.

For example, the memristor array includes an operating mode and a computing mode. When the memristor array is in the operating mode, the memristor unit is in the initial state, and the values of the parameter elements in the convolution parameter matrix may be written into the memristor array. For example, the source line input voltage, bit line input voltage and word line input voltage of the memristor are switched to corresponding preset voltage ranges through the multiplexers.

For example, the word line input voltage is switched to the corresponding voltage range through the control signal WL_sw[1:M] of the multiplexer in the word line driving circuit in FIG. 9B. For example, when performing a setting operation on the memristor, the word line input voltage is set to 2V (volts); for example, when performing a reset operation on the memristor, the word line input voltage is set to 5V, for example, the word line input voltage may be obtained by the voltage signals V_WL[1:M] in FIG. 9B.

For example, the source line input voltage is switched to the corresponding voltage range through the control signals SL_sw[1:M] of the multiplexer in the source line driving circuit in FIG. 9B. For example, when performing a setting operation on the memristor, the source line input voltage is set to 0V, for example, when performing a reset operation on the memristor, the source line input voltage is set to 2V, for example, the source line input voltage may be obtained from the voltage signals V_SL[1:M] in FIG. 9B.

For example, the bit line input voltage is switched to the corresponding voltage range through the control signals BL_sw[1:N] of the multiplexer in the bit line driving circuit in FIG. 9B. For example, when performing a setting operation on the memristor, the bit line input voltage is set to 2V, for example, when performing a reset operation on the memristor, the bit line input voltage is set to 0V, for example, the source line input voltage may be obtained by the DAC in FIG. 9B.

When the memristor array is in the computing mode, at this time, the memristors in the memristor array are in a conductive state that may be used for calculation. The bit line input voltages input at the column signal input terminals do not change the conductance value of the memristor, so that the convolution processing is completed by performing multiply-accumulate operation through the memristor array. For example, the word line input voltage is switched to the corresponding voltage range by the control signal WL_sw[1:M] of the multiplexer in the word line driving circuit in FIG. 9B, for example, when the turn-on signal is applied, the input voltage of the word line of the corresponding row is set to 5V, for example, when the turn-on signal is not applied, the input voltage of the word line of the corresponding row is set to 0V, for example, the GND signal is input. The source line input voltage is switched to the corresponding voltage range by the control signal SL_sw[1:M] of the multiplexer in the source line driving circuit in FIG. 9B, for example, the input voltage of the source line is set to 0V, so that the current signals of the row signal output terminals may flow into the data output circuit. The bit line input voltage is switched to the corresponding voltage range by the control signal BL_sw[1:N] of the multiplexer in the bit line driving circuit in FIG. 9B, for example, the input voltage of the bit line is set to 0.1V-0.3V, so that the convolution processing may be performed by taking advantage of the multiply-accumulate operation characteristics of the memristor array.

For example, the data output circuit includes a plurality of ADCs (Analog to Digital converters), which may convert the current signals of the plurality of row signal output terminals into digital signals for subsequent processing.

Figure 9C:
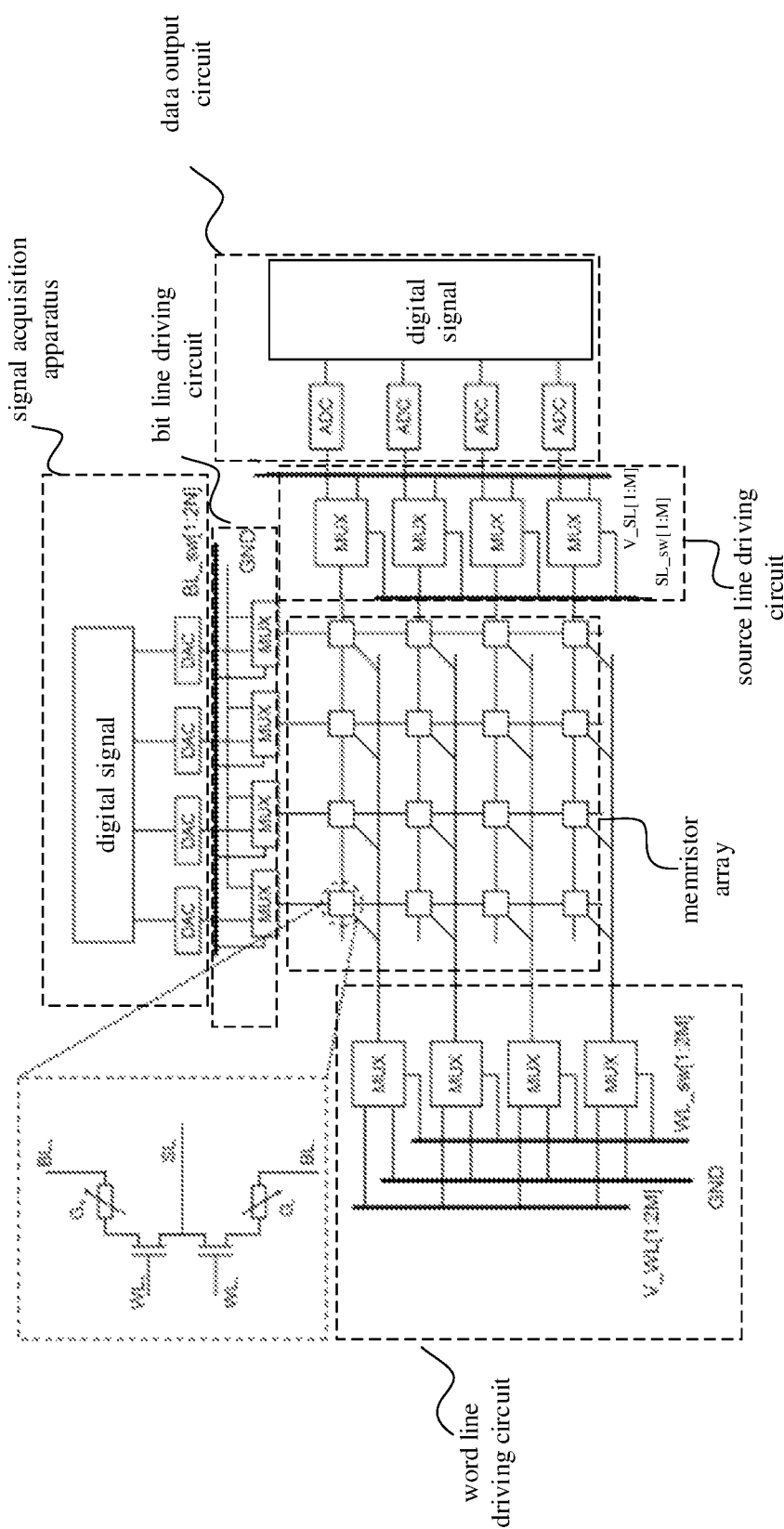
FIG. 9C is a schematic diagram of another electronic apparatus provided by at least one embodiment of the present disclosure.

FIG. 9C is a schematic diagram of another electronic apparatus provided by at least one embodiment of the present disclosure.

The electronic apparatus shown in FIG. 9C has the same structure as the electronic apparatus shown in FIG. 9B, and also includes a signal acquisition apparatus, a word line driving circuit, a bit line driving circuit, a source line driving circuit, a memristor array and a data output circuit.

For example, a memristor array includes M source lines, 2M word lines, and 2N bit lines, and a plurality of memristor units arranged in M rows and N columns. For example, each memristor unit is the 2T2R structure, and the convolution parameter matrix used for convolution processing is mapped to different memristor sub-arrays in the memristor array for a plurality of times. The specific process is as described in step S120, which will not be repeated here.

It should be noted that the memristor array may also include M source lines, M word lines and 2N bit lines, and a plurality of memristor units arranged in M rows and N columns. Because the turn-on signals are applied to the signal control terminals of the memristor array at the same time when step S130 is performed, two memristors in each row of memristor units may be controlled by each word line at the same time.

The descriptions of the signal acquisition apparatus, the control driving circuit and the data output circuit are as described above, which will not be repeated here.

The above description is only the preferred embodiment of the present disclosure and the explanation of the applied technical principle. It should be understood by those skilled in the art that the disclosure scope involved in this disclosure is not limited to the technical scheme formed by the specific combination of the above technical features, but also covers other technical schemes formed by any combination of the above technical features or their equivalent features without departing from the above disclosed concept. For example, the technical solution formed by replacing the above features with (but not limited to) technical features with similar functions disclosed in this disclosure.

In addition, although operations are depicted in a specific order, this should not be understood as requiring these operations to be executed in the specific order shown or in a sequential order. Under certain circumstances, multitasking and parallel processing may be beneficial. Similarly, although several specific implementation details are included in the above discussion, these should not be interpreted as limiting the scope of the present disclosure. Some features described in the context of separate embodiments can also be implemented in a single embodiment in combination. On the contrary, various features described in the context of a single embodiment can also be implemented in multiple embodiments alone or in any suitable sub-combination.

Although the matter has been described in language specific to structural features and/or logical acts of methods, it should be understood that the matter defined in the appended claims is not necessarily limited to the specific features or acts described above. On the contrary, the specific features and actions described above are only example forms of realizing the claims.

For this disclosure, the following points need to be explained:

(1) The drawings of the embodiments of the present disclosure only relate to the structures related to the embodiments of the present disclosure, and other structures can refer to the general design.

(2) Without conflict, the embodiments of the present disclosure and the features in the embodiments can be combined with each other to obtain a new embodiment.

The above is only the specific implementation of the present disclosure, but the scope of protection of the present disclosure is not limited to this. The scope of protection of the present disclosure should be based on the scope of protection of the said claims.

What is claimed is:

1. A data processing method based on a memristor array, wherein the memristor array comprises a plurality of memristor units arranged in an array, and the memristor array is configured to perform a multiply-accumulate operation, the method comprises:

acquiring a plurality of first analog signals;

setting the memristor array, and writing data corresponding to a convolution parameter matrix of a convolution processing into the memristor array, wherein the convolution parameter matrix is a first matrix and comprises a plurality of parameter elements arranged in an array, the plurality of parameter elements are correspondingly mapped to a plurality of memristor sub-arrays in the memristor array for a plurality of times in a form of the first matrix, and the plurality of memristor sub-arrays are different, for any memristor unit in any memristor sub-array among the plurality of memristor sub-arrays, the any memristor unit is only comprised in the any memristor sub-array but not comprised in any other memristor sub-arrays among the plurality of memristor sub-arrays; and inputting the plurality of first analog signals respectively into a plurality of column signal input terminals of the memristor array that has been set, controlling operation of the memristor array to perform the convolution processing on the plurality of first analog signals, and obtaining a plurality of second analog signals after performing the convolution processing at a plurality of row signal output terminals of the memristor array, respectively.

2. The data processing method according to claim 1, wherein acquiring a plurality of first analog signals comprises:

acquiring a plurality of initial digital signals; and performing digital-to-analog conversion processing on the plurality of initial digital signals to obtain the plurality of first analog signals, respectively.

3. The data processing method according to claim 1, wherein each memristor sub-array corresponds to the first matrix, and the plurality of memristor sub-arrays correspond to different column signal input terminals, respectively, the plurality of parameter elements are correspondingly mapped to the plurality of memristor sub-arrays in the memristor array for a plurality of times in a form of the first matrix, comprises:

sequentially selecting an object column group to be subjected to the convolution processing from the plurality of column signal input terminals, wherein the object column group comprises at least one column signal input terminal; and for a selected object column group, correspondingly mapping the plurality of parameter elements into an object memristor sub-array in the form of the first matrix, wherein the object memristor sub-array is a memristor sub-array corresponding to the selected object column group among the plurality of memristor sub-arrays.

4. The data processing method according to claim 3, wherein each memristor sub-array comprises a plurality of target memristor units,
for the selected object column group, correspondingly mapping the plurality of parameter elements into the object memristor sub-array in the form of the first matrix, comprises:
mapping parameter elements of a same row in the first matrix to target memristor units of a same row in the object memristor sub-array; and
mapping parameter elements of a same column in the first matrix to target memristor units of a same column in the object memristor sub-array.

5. The data processing method according to claim 4, wherein each row of the convolution parameter matrix comprises Q parameter elements,
each memristor unit comprises at least one memristor, each memristor is capable of setting to an initial state, and
mapping parameter elements of the same row in the first matrix to target memristor units of the same row in the object memristor sub-array, comprises:
for each row of parameter elements of the convolution parameter matrix, selecting Q target memristor units from one row of memristor units corresponding to the object memristor sub-array in the memristor array to correspond to the Q parameters element one by one, and then setting memristors in memristor units other than the Q target memristor units in the one row of memristor units to the initial state, wherein Q is a positive integer greater than 1.

6. The data processing method according to claim 5, wherein selecting Q target memristor units from one row of memristor units corresponding to the object memristor sub-array in the memristor array to correspond to the Q parameters element one by one, comprises:
for each parameter element of the Q parameter elements, according to a numerical value of the parameter element, setting at least one memristor comprised in a target memristor unit corresponding to the parameter element in the Q target memristor units as a whole to a conductive state, so as to make the at least one memristor comprised in the target memristor unit available for calculation and have a conductance value corresponding to the numerical value.

7. The data processing method according to claim 3, wherein sequentially selecting the object column group to be subjected to the convolution processing from the plurality of column signal input terminals, comprises:
according to a convolution stride of the convolution processing, sequentially selecting the object column group to be subjected to the convolution processing from the plurality of column signal input terminals.

8. The data processing method according to claim 1, wherein the convolution parameter matrix is the first matrix arranged in 2*P rows and Q columns,
the convolution parameter matrix comprises a first sub-convolution parameter matrix with P rows and Q columns and a corresponding second sub-convolution parameter matrix with P rows and Q columns,
a parameter element in the first sub-convolution parameter matrix and a parameter element of a position with a corresponding row and column in the second sub-convolution parameter matrix collectively represent a parameter element for performing the convolution processing, wherein P is a positive integer greater than or equal to 1, and Q is a positive integer greater than 1.

9. The data processing method according to claim 8, wherein the first sub-convolution parameter matrix comprises P rows of first parameter elements, the second sub-convolution parameter matrix comprises P rows of second parameter elements, row and column positions of the P rows of first parameter elements and the P rows of second parameter elements are in one-to-one correspondence,
obtaining a plurality of second analog signals after performing the convolution processing respectively at the plurality of row signal output terminals of the memristor array, comprises:
for each memristor sub-array,
determining at least one group of rows to be processed, wherein each group of rows to be processed comprises one row of target memristor units corresponding to one row of first parameter elements, and one row of target memristor units corresponding to one row of second parameter elements, wherein the one row of second parameter elements corresponds to the one row of first parameter elements; and
performing current preprocessing on current signals of two row signal output terminals corresponding to two rows of target memristor units comprised in each group of rows to be processed, to obtain a second analog signal corresponding to each group of rows to be processed.

10. The data processing method according to claim 9, wherein the current preprocessing is a current subtraction processing or a current addition processing.

11. The data processing method according to claim 1, wherein the memristor array comprises a first memristor array and a second memristor array, the convolution parameter matrix comprises a first sub-convolution parameter matrix and a second sub-convolution parameter matrix, and the first sub-convolution parameter matrix and the second sub-convolution parameter matrix are both in the form of the first matrix,
the first sub-convolution parameter matrix is correspondingly mapped to different memristor sub-arrays in the first memristor array for a plurality of times in the form of the first matrix,
the second sub-convolution parameter matrix is correspondingly mapped to different memristor sub-arrays in the second memristor array for a plurality of times in the form of the first matrix.

12. The data processing method according to claim 11, wherein obtaining the plurality of second analog signals after performing the convolution processing respectively at the plurality of row signal output terminals of the memristor array, comprises:
performing current preprocessing on a current signal of each row signal output terminal in the first memristor array and a current signal of a corresponding row signal output terminal in the second memristor array, to obtain the plurality of second analog signals.

13. The data processing method according to claim 12, wherein the current preprocessing is a current subtraction processing or a current addition processing.

14. The data processing method according to claim 1, further comprising:
performing analog-to-digital conversion processing on the plurality of second analog signals, to convert the plurality of second analog signals into a plurality of digital signals for subsequent processing.

15. The data processing method according to claim 1, wherein the plurality of first analog signals are analog voltage signals, and the plurality of second analog signals are analog current signals.

16. An electronic apparatus, comprising:
an memristor array, configured to perform multiply-accumulate operation;
a signal acquisition apparatus, configured to acquire a plurality of first analog signals;
a control driving circuit, wherein the control drive circuit is configured to perform following steps:
setting the memristor array, and writing data corresponding to a convolution parameter matrix of a convolution processing into the memristor array, wherein the convolution parameter matrix is a first matrix and comprises a plurality of parameter elements arranged in an array, the plurality of parameter elements are correspondingly mapped to a plurality of memristor sub-arrays in the memristor array for a plurality of times in a form of the first matrix, and the plurality of memristor sub-arrays are different, for any memristor unit in any memristor sub-array among the plurality of memristor sub-arrays, the any memristor unit is only comprised in the any memristor sub-array but not comprised in any other memristor sub-arrays among the plurality of memristor sub-arrays; and
inputting the plurality of first analog signals respectively into a plurality of column signal input terminals of the memristor array that has been set, controlling operation of the memristor array to perform the convolution processing on the plurality of first analog signals, and obtaining a plurality of second analog signals after performing the convolution processing at a plurality of row signal output terminals of the memristor array, respectively.

17. The electronic apparatus according to claim 16, wherein the signal acquisition apparatus comprises a digital signal acquisition circuit and a digital-to-analog conversion circuit,
the digital signal acquisition circuit is configured to acquire a plurality of initial digital signals; and
the digital-to-analog conversion circuit is configured to perform digital-to-analog conversion processing on the plurality of initial digital signals to obtain the plurality of first analog signals respectively.

18. The electronic apparatus according to claim 16, wherein the control driving circuit comprises:
a source line driving circuit, configured to detect the plurality of second analog signals and perform initialization operation on the memristor array;
a word line driving circuit, configured to apply turn-on signals to a plurality of signal control terminals of the memristor array and perform initialization operation on the memristor array; and
a bit line driving circuit, configured to apply input signals to the plurality of column signal input terminals and perform initialization operation on the memristor array, wherein the input signals at least comprise the plurality of first analog signals.

19. The electronic apparatus according to claim 16, further comprising a data output circuit,
wherein the data output circuit is configured to convert the plurality of second analog signals into digital signals, to respectively convert the plurality of second analog signals into a plurality of digital signals for subsequent processing.

20. The electronic apparatus according to claim 16, wherein each memristor sub-array corresponds to the first matrix, and the plurality of memristor sub-arrays correspond to different column signal input terminals, respectively,
the plurality of parameter elements are correspondingly mapped to a plurality of memristor sub-arrays in the memristor array for a plurality of times in a form of the first matrix, comprises:
sequentially selecting an object column group to be subjected to the convolution processing from the plurality of column signal input terminals, wherein the object column group comprises at least one column signal input terminal; and
for a selected object column group, correspondingly mapping the plurality of parameter elements into an object memristor sub-array in the form of the first matrix, wherein the object memristor sub-array is a memristor sub-array corresponding to the selected object column group among the plurality of memristor sub-arrays.

* * * * *